(12) United States Patent
Barth

(10) Patent No.: US 12,651,632 B2
(45) Date of Patent: Jun. 9, 2026

(54) MEMORY CELL WITH DYNAMIC DISTURB REDUCTION

(71) Applicant: Synopsys, Inc., Sunnyvale, CA (US)

(72) Inventor: John Edward Barth, Williston, VT (US)

(73) Assignee: Synopsys, Inc., Sunnyvale, CA (US)

( * ) Notice: Subject to any disclaimer, the term of this patent is extended or adjusted under 35 U.S.C. 154(b) by 32 days.

(21) Appl. No.: 18/670,401

(22) Filed: May 21, 2024

(65) Prior Publication Data

US 2025/0364039 A1     Nov. 27, 2025

(51) Int. Cl.
*G11C 11/419* (2006.01)
(52) U.S. Cl.
CPC .................................. *G11C 11/419* (2013.01)
(58) Field of Classification Search
CPC ............................ G11C 11/418; G11C 11/419
USPC ........................................................ 365/154
See application file for complete search history.

(56) References Cited

U.S. PATENT DOCUMENTS

| | | | |
|---|---|---|---|
| 2013/0021839 A1* | 1/2013 | Ishikura | ................ G11C 11/412 |
| | | | 365/154 |
| 2019/0096476 A1* | 3/2019 | Chen | ..................... G11C 7/1075 |
| 2022/0359015 A1* | 11/2022 | Schreiber | ............... G11C 16/08 |
| 2024/0357790 A1* | 10/2024 | Liaw | ..................... H10B 10/12 |

FOREIGN PATENT DOCUMENTS

CN 115810374 * 3/2023 ............... G11C 7/06

* cited by examiner

*Primary Examiner* — Sung Il Cho
(74) *Attorney, Agent, or Firm* — Patterson + Sheridan, LLP

(57) ABSTRACT

A memory cell with dynamic disturb reduction includes first and second inverters in a cross-coupled arrangement, a write circuit to write to the memory cell, a read circuit to read the memory cell, and an interrupt circuit to disable at least a portion of the first inverter when the read circuit reads the memory cell.

17 Claims, 24 Drawing Sheets

1300

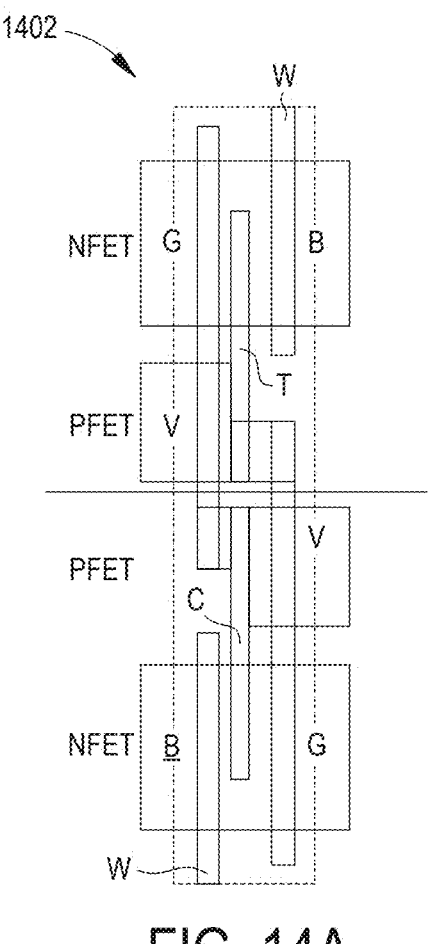
FIG. 14A
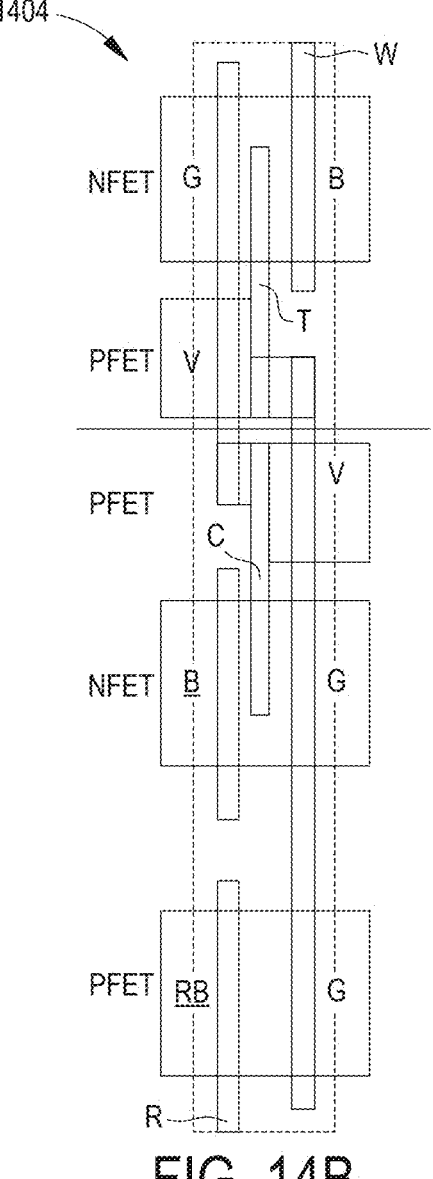
FIG. 14B
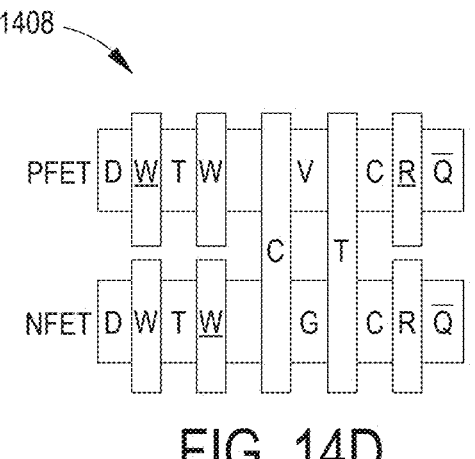
FIG. 14C          FIG. 14D

1410

RW

PFET D W T V C R Q̄

C T

NFET D W T G C R Q̄

RW

1412

PFET D W T W V C R Q̄

C T

NFET D W T G C R Q̄

RW

1414

W1                    RW

PFET V W T V C

C T

NFET G W T G C R Q̄

W0                    RW

1416

W1          RW

PFET V W T V C R Q̄

C T

NFET G W T G C R Q̄

W0          RW

1418

W1                    RW

PFET V W T V C

C T

NFET G W T G C R Q̄

W0                    RW

1600

MEMORY CELL WITH DYNAMIC DISTURB REDUCTION

TECHNICAL FIELD

The present disclosure relates to integrated circuits and, more particularly, to a memory cell with dynamic disturb reduction.

BACKGROUND

Static random-access memory (SRAM) cells may suffer from read disturb bumps and write failures. Read disturb bumps arise from voltage dividers within read circuitry, and may flip states of the SRAM cells to states that are determined by random device mismatches. Write failures arise due to contention within cross-coupled inverters of the SRAM cells. Read disturb bumps and write failures become more pronounced at smaller fabrication scales/lower operating voltages.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 14A through 14I illustrate physical cell representations of memory cells presented herein, according to an embodiment.

DETAILED DESCRIPTION

Aspects of the present disclosure relate to memory cell with dynamic disturb reduction.

A 6-transistor, single-port, un-buffered, static random-access memory (SRAM) cell may suffer from read disturb bumps that arise from voltage dividers within read circuitry of the memory cell. The read disturb bumps may flip a state of the SRAM cell to a state that is determined by random device mismatches. An 8-transistor, dual-port, buffered SRAM cell may suffer from write failures due to contention within cross-coupled inverters of the SRAM cells. Read disturb bumps and write failures become more pronounced at smaller fabrication scales and lower operating voltages and thus limit minimum voltage VDD operation.

Read disturb bumps and write failures may be addressed with read and write assists methods (e.g., wordline underdrive and negative bitline boost), broken feedback write circuits, and buffered read circuitry, but at a cost of increased area and power consumption. As an example, a two-port SRAM cell may include broken feedback write circuitry that reduces or eliminates write contention, but at a cost of four additional transistors (i.e., a 10-transistor SRAM cell). A two-port SRAM cell may further include buffered read circuitry that isolates cross-coupled inverters from read disturb bumps (i.e., a 12-transistor, latch-based/buffered read, SRAM cell), but at a cost of two additional transistors. A 12-transistor, latch-based/buffered read SRAM cell may not support write masking.

A memory cell with dynamic disturb reduction, as disclosed herein, may encompass as few as 5 contacted poly pitches or gates (CPPs) of an integrated circuit device. A memory cell with dynamic disturb reduction and write masking circuitry, as disclosed herein, may encompass as few as 6 CPPs.

Technical advantages of the present disclosure include, but are not limited to, improved read and write reliability with little or no increase in transistor count, area requirements, or power consumption.

Figure 1A:
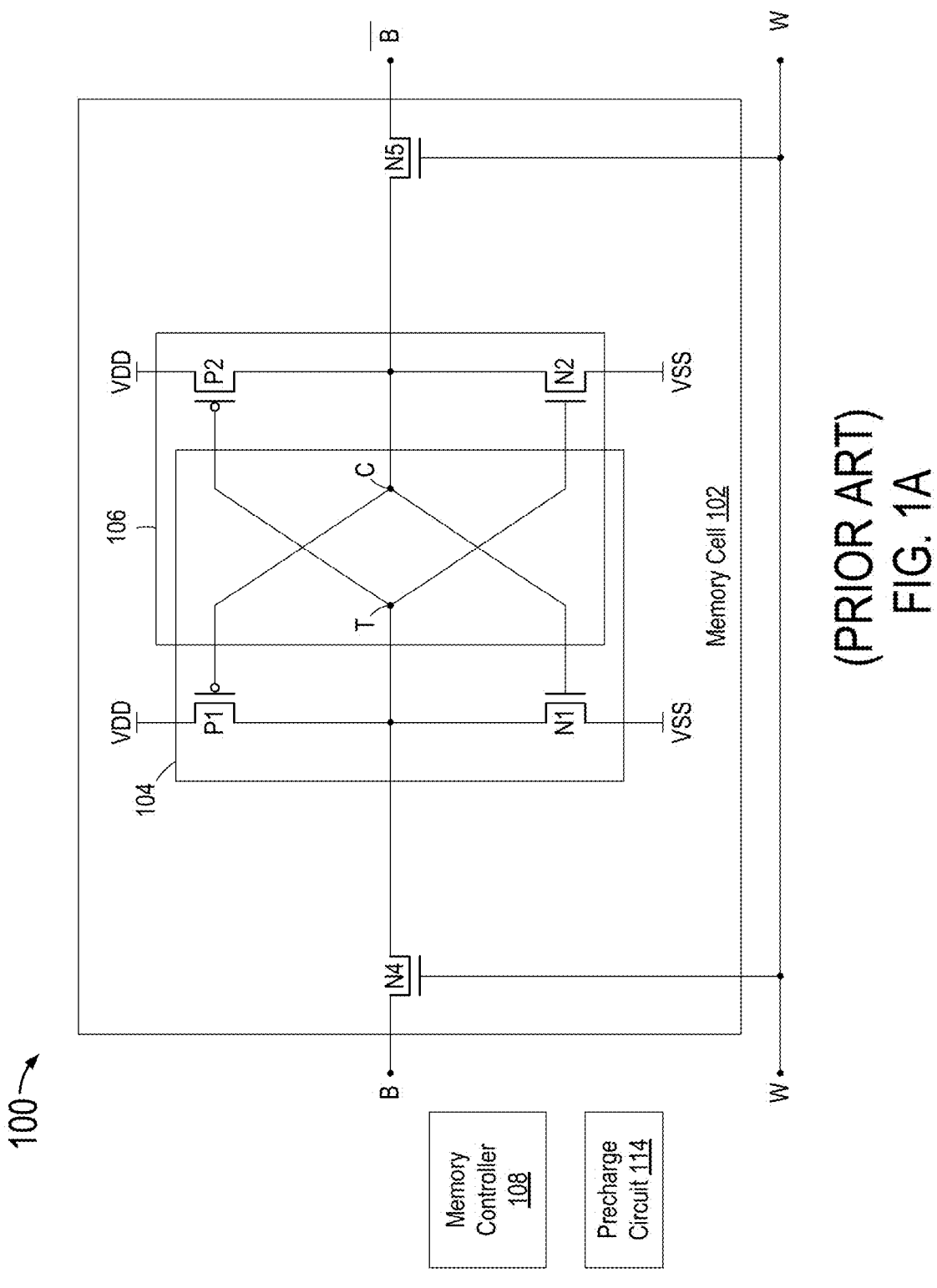
FIG. 1A is a schematic diagram of an integrated circuit (IC) that includes a 6-transistor, single-wordline, single-port memory cell.

FIG. 1A is a schematic diagram of an integrated circuit (IC) 100 that includes a 6-transistor, single-wordline, single-port memory cell 102. IC 100 further includes a memory controller 108 that controls a wordline W, and a pre-charge circuit 114 that pre-charges bitlines B and $\overline{B}$ for read operations, such as described further below. IC 100 may represent a physical IC circuit and/or a computer-based IC design. Memory cell 102 may represent a static random-access memory (SRAM) cell. As described further below with reference to FIG. 14A, memory cell 102 encompasses 2 rows by 2 contacted poly gates or pitches (CPPs), which is equivalent to 1 row of 4 CPPs.

In the example of FIG. 1A, memory cell 102 includes first and second inverters 104 and 106 in a cross-coupled or contention-based arrangement. First inverter 104 includes an input node C. Second inverter 106 includes an input node T. Node T also serves as an output of first inverter 104, and node C also serves as an output of second inverter 106. First inverter 104 further includes a pull-up transistor P1 that pulls up node T to a supply voltage VDD when node C is pulled down to a reference voltage VSS (e.g., ground). First inverter 104 further includes a pull-down transistor N1 that pulls down node T to reference voltage VSS when node C is pulled up to supply voltage VDD. In other words, when node C is logic 0, first inverter 104 asserts a logic 1 at node T. When node C is logic 1, first inverter 104 asserts a logic 0 at node T. Similarly, second inverter 106 includes a pull-up transistor P2 that pulls up node C to supply voltage VDD when node T is pulled down to reference voltage VSS. Second inverter 106 further includes a pull-down transistor N2 that pulls down node C to reference voltage VSS when node T is pulled up to supply voltage VDD. In other words, when node T is logic 0, second inverter 106 asserts a logic 1 at node C. When node T is logic 1, second inverter 106 asserts a logic 0 at node C. When one of nodes T and C is logic 0 and the other one of nodes T and C is logic 1, inverters 104 and 106 resist changes to the states at nodes T and C.

Memory cell 102 further includes pass gate transistors N4 and N5 for writing opposing logic states from bitlines B and $\overline{B}$ to respective nodes T and C, and for reading states of nodes T and C to bitlines B and $\overline{B}$. During a write operation, memory controller 108 pulls up write wordline W to VDD and asserts a desired logic state on bitline B and an opposing logic state on bitline $\overline{B}$. When writeline W is pulled up to VDD, if node T is logic 1 and bitline B is logic 0, transistor N4 turns on and pulls down node T to logic 0. The logic 0 at node T turns on transistor P2 and turns off transistor N2, such that node C is pulled up to logic 1 via transistor P2. Conversely, if node C is logic 1 and bitline $\overline{B}$ is logic 0, transistor N5 turns on and pulls down node C to logic 0. The logic 0 at node C turns off transistor N1 and turns on transistor P1, such that node T is pulled up to VDD via transistor P1. When writeline W is deactivated, nodes T and C remain at logic 1 and 0 due as described further above.

For a read operation, pre-charge circuit 114 pre-charges and releases (floats or places in a high impedance state) bitlines B and $\overline{B}$ prior to 108 pulling up the wordline W to VDD. If node T is logic 1 and node C is logic 0, bitline B remains at the pre-charge state of VDD (i.e., Vgs of transistor N4 is zero), and bitline $\overline{B}$ is pulled down to VSS via transistors N5 and N2. Conversely, if node T is logic 0 and node C is logic 1, bitline B is pulled down to VSS via transistors N4 and N1, and bitline $\overline{B}$ remains at the precharge state of VDD (i.e., Vgs of transistor N5 is zero).

During write operations, memory cell 102 may encounter write contention (i.e., resistance to change). During read operations, memory cell 102 may encounter read voltage bumps. Write contention and/or read voltage bumps may cause memory cell 102 to exhibit inconsistent or unreliable write (e.g., fail to write the intended data) and/or read operations (e.g., may disturb or unintentionally flip logic states at nodes T and C). Write contention and read voltage bumps are described below.

During write and read operations, transistor N4 forms a voltage divider with one of transistors N1 and P1, and transistor N5 forms a voltage with one of transistors N2 and P2, due to inherent resistances of the respective transistors. For example, when overwriting a logic 0 at node T with a logic 1 (i.e., and overwriting a corresponding logic 1 at node C with a logic 0), pull-down transistor N1 and pull-up transistor P2 are initially on, and pull-up transistor P1 and pull-down transistor N2 are initially off. When write wordline W is pulled up to VDD, and $\overline{B}$ is driven to VSS (i.e., logic 0), transistors N5 and P2 form a voltage divider.

If the inherent resistance of transistor P2 is substantially higher than the inherent resistance of transistor N5, node C initially falls below VDD/2. As the voltage at node C falls below VDD/2, transistor P1 begins to turn on and transistor N1 begins to turn off, which increases the voltage at node T. Correspondingly, as the voltage at node T rises above VDD/2, transistor P2 begins to turn off and transistor N2 begins to turn on (i.e., the resistance of transistor P2 increases), which further decreases the voltage at node C. In order to complete the write operation, the voltage at node T must rise sufficiently to turn off transistor P2 and turn on transistor N2, and the voltage at node C must fall sufficiently to turn on transistor P1 and turn off transistor N1.

In practice, when writing a logic 1 to node T, the Vgs of transistor N4 may be too low to permit transistor N4 to pull-up node T, and the write operation may depend primarily on transistor N5. Similarly, when writing a logic 1 to node C, the Vgs of transistor N5 may be too low to permit transistor N5 to pull-up node C, and the write operation may depend primarily on transistor N4.

At lower operating voltages (i.e., lower values of VDD), the trip points of inverters 104 and 106 are determined primarily by the threshold voltages of respective transistors P1 and N1, and P2 and N2. The threshold voltages of transistors P2 and N2 do not change at lower operating voltages so, when writing logic 0 to node T, transistor N4 must pull down node T further towards VSS. Similarly, when writing logic 0 to node C, transistor N5 must pull down node T further towards VSS. Selecting transistors N4 and N5 to have relatively high drive strength may help to overcome contention. As described below, however, relatively strong pass gate transistors N4 and N5 may disturb (e.g., may tend to change/flip) states of nodes T and C during read operations.

During a read operation, pre-charged bitline B or pre-charged bitline $\overline{B}$ may result in read voltage bumps in the voltage dividers, which may disturb or inadvertently flip states of node T and C. In an example, when reading a logic 0 at node C, (i.e., transistor N2 is on), bitline $\overline{B}$ is pre-charged to VDD, and wordline W is pulled up to VDD. In this situation, pre-charged bitline $\overline{B}$ may initially/briefly pull up node C towards VDD/2 (i.e., a read voltage bump), which is close to the trip point for turning off transistor P1 and turning off transistor N1 of inverter 104. Even if the read bump only partially turns off transistor P1 and only partially turns on transistor N1, the voltage at node T may decrease. The decreased voltage at node T may begin to turn on transistor P2 and turn off transistor N2, which would further increase the voltage at node C, which may eventually flip the states of nodes T and C. Read voltage bumps may be reduced with weaker pass gate transistors N4 and N5. Transistors N4 and N5 must, however, be sufficiently strong to overcome contention during write operations.

Transistors P1, P2, N1, N2, N4, and N5, may be selected/sized to balance write contention and read voltage bumps (i.e., to manage voltage/resistance ratios of the voltage dividers). However, impacts of read voltage bumps at input nodes C and T may be more pronounced with smaller fabrication technologies/lower operating voltages, and the relative small number of transistors may make it more difficult to balance the resistance ratios to ensure reliable write operations without destabilizing read operation. More-over, at smaller fabrication scales/operating voltages, inher-ent variations amongst transistors may become deciding factors in stability. Thus, at lower operating voltages, re-sizing transistors may not be sufficient manage voltage/resistance ratios to provide consistent and reliable write and read operations.

One way to address the conflict/balance between write contention and read disturb bumps is to lower the operating voltage of the word-line W (i.e., reduce Vgs to pull-up transistors P1 and P2) during read operations to reduce the resistances of pass gate transistors N4 and N5). This may be referred to as a read assist. Read assist may help to reduce read disturb bumps. Another option is to boost bitlines B and $\overline{B}$ below VSS for write operations. This be referred to as a negative bit-line (NBL) approach. An NBL approach may increase the drive strength of pass gate transistors N during write operations. Another option is to increase the number of transistors, examples of which are provided further below.

IC 100 may include a matrix of multiple instances of memory cell 102 that share bitline pairs B and $\overline{B}$ in a first dimension and word-lines in a second dimension. Cells sharing the same word-line can perform simultaneous read or write operations, while cells sharing the same bit-line pair can perform only one read or write to the cell selected by the word-line. For some memory cell types, it is possible to write only a portion of the cells sharing the same word-line (i.e., a masked write). The portion of the cells that are not written and deemed to be "masked".

Figure 1B:
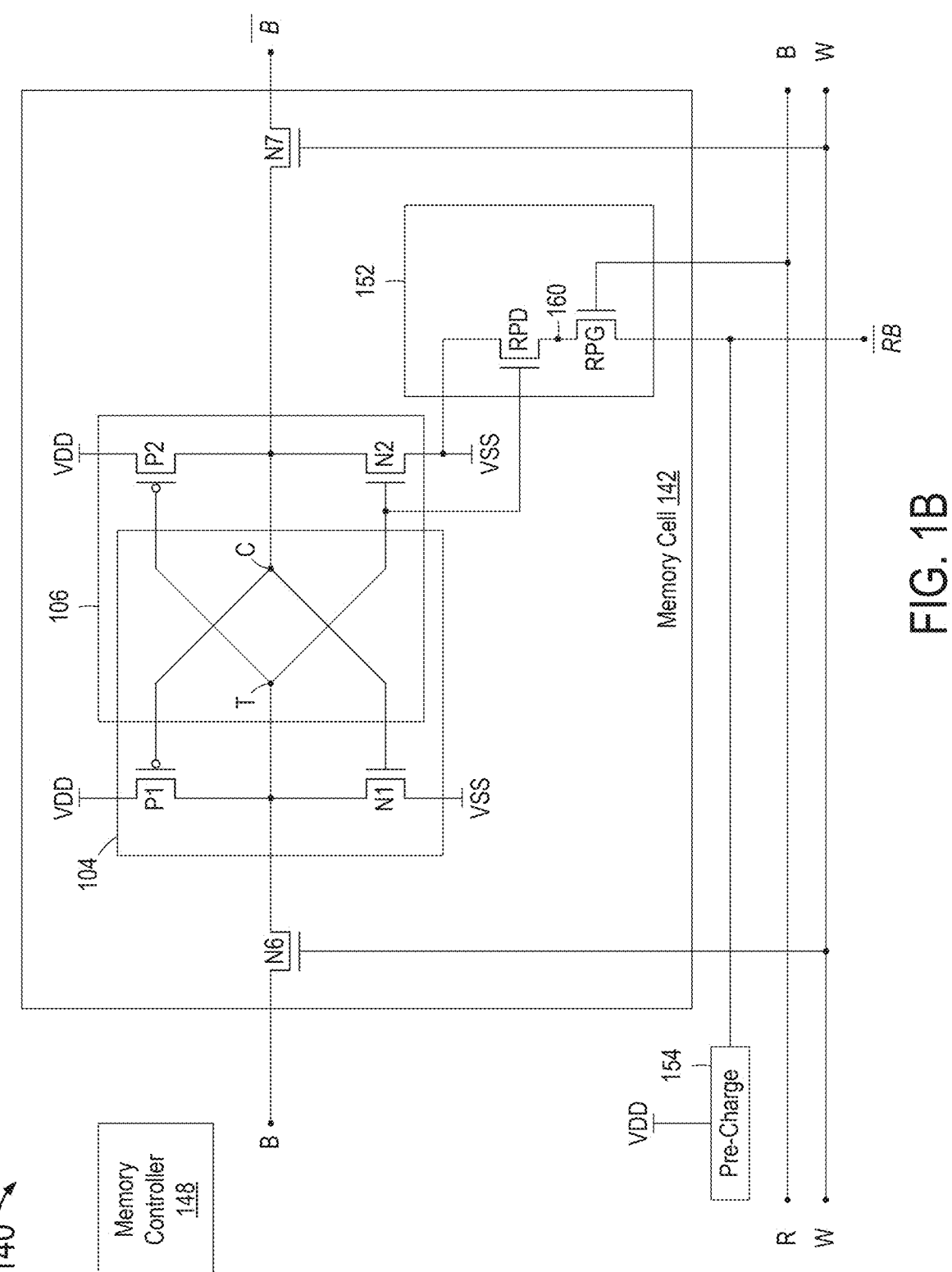
FIG. 1B is a schematic diagram of an IC that includes a two-port, 8-transistor, 2-wordline, memory cell.

FIG. 1B is a schematic diagram of an IC 140 that includes a two-port, 8-transistor, 2-wordline, memory cell 142. As described further below with reference to FIG. 14B, memory cell 142 encompasses the equivalent of 5 CPPs.

Memory cell 142 includes cross-coupled inverters 104 and 106 of IC 100, as described above with respect to FIG. 1. Memory cell 142 further includes a memory controller 148 that controls a write wordline W, a read wordline R, write bitlines B and $\overline{B}$, and a read bitline $\overline{RB}$. IC 140 further include a pre-charge circuit 154 that pre-charges read bitline $\overline{RB}$ to VDD for read operations.

Memory cell 142 further includes write transistors N6 and N7 that write opposing logic states from write bitlines B and $\overline{B}$ to respective nodes T and C, when writeline W is pulled up to VDD, such as described above with reference to FIG. 1A.

Memory cell 142 further includes read circuitry 152 that reads node T to read bitline $\overline{RB}$ based on read wordline R. Read circuitry 152 includes a read pass gate transistor RPG, and a buffer transistor RPD. A gate of buffer transistor RPD is controlled by node T. A gate of transistor RPG is con-trolled by read wordline R. For a read operation, pre-charge circuit 154 pre-charges read bitline $\overline{RB}$ to VDD, and memory controller 148 pulls up read wordline R to VDD. If node T is logic 1, gates of transistors RPD and RPG are pulled up to VDD, and transistors RPD and RPG form a series stack between $\overline{RB}$ and VSS. In this situation, RPD and RPG turn on and discharge read bitline $\overline{RB}$ to VSS. A voltage bump may occur at a node 160 of the voltage divider formed by transistors RPD and RPG, but transistor RPD serves as a buffer that prevents the voltage bump from transferring to node T. If node T is logic 0, the gate of transistor RPD is at VSS, and transistors RPD and RPG remains off. In this situation, read bitline $\overline{RB}$ remains at the pre-charge state of VDD (i.e., logic 1). Read circuit 212 thus outputs an opposite state of node T.

In FIG. 1B, write transistors N6 and N7 may be designed/selected for relatively high drive strength, without impacting read circuitry 152, and read circuitry 152 isolates nodes C and T from read voltage bumps, but at a cost of 2 additional transistors and an increase of 1 equivalent CPP, relative to memory cell 102.

IC 140 may include multiple instances of memory cell 142 that share write wordlines B and $\overline{WB}$ and read wordline R, but use respective read bitlines, such that one of the memory cells can be written to without disturbing contents/states of the other memory cells, equivalent to a read of memory cell 102 in FIG. 1A (masked writing). However, when writing to another memory cell of write wordlines B and $\overline{WB}$ (i.e., writing to another column), activation of write wordlines B and $\overline{WB}$ may result in write voltage bumps at node T and/or node C (i.e., depending on whether write bitline B or write bitline $\overline{B}$ is logic 1), similar to the read voltage bumps described above. The write voltage bumps may disturb the voltages at nodes T and C, which may inadvertently flip the state of memory cell 142 and, as such, has an elevated disturb hazard during masked writing.

Figure 2:
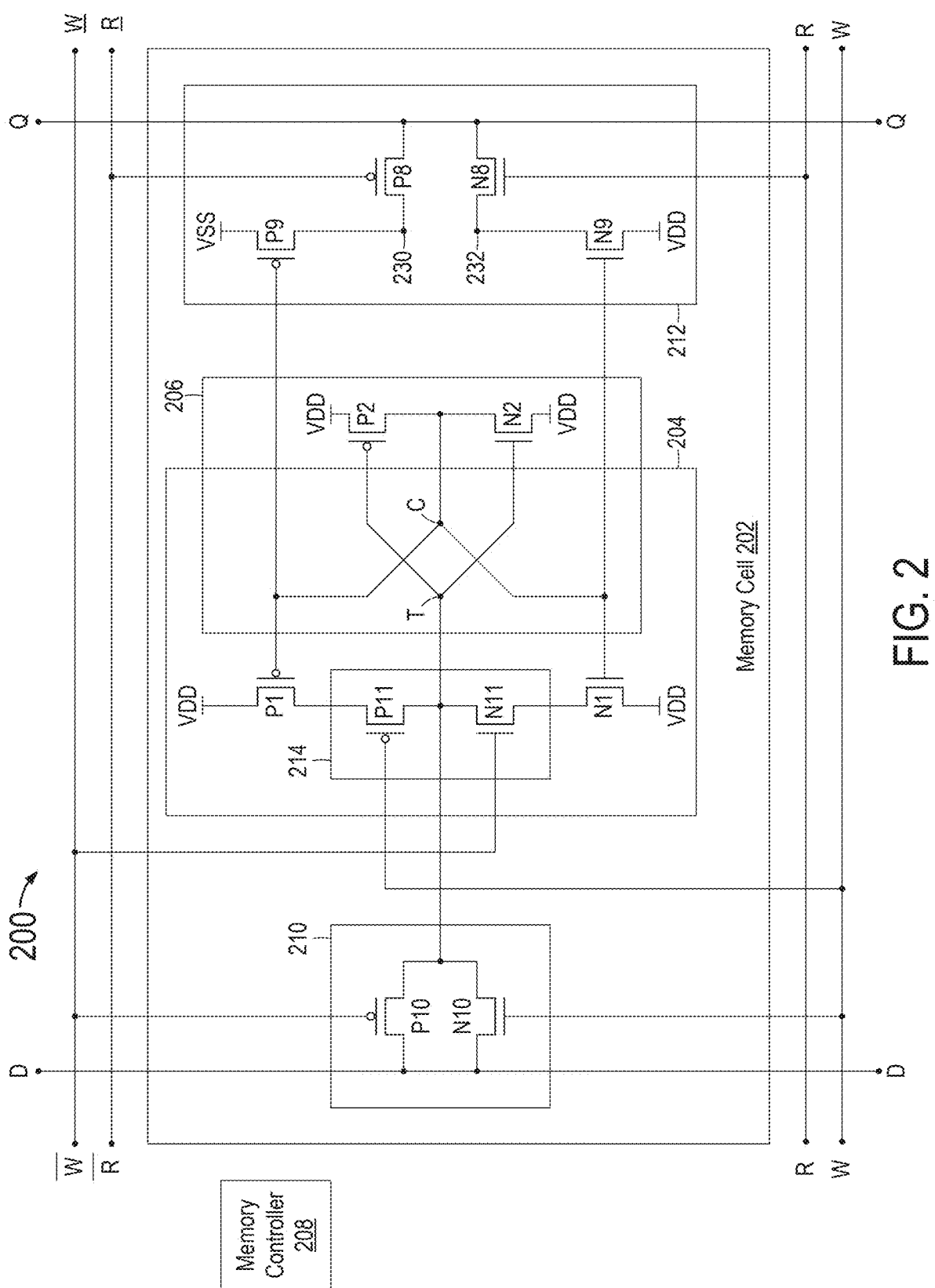
FIG. 2 is a schematic diagram of an IC that includes a 12-transistor, 4-wordline, latch-based memory cell with broken feedback write, and buffered read.

Impacts of voltage bumps may be reduced or eliminated with a latch-based/buffered-read memory cell, such as described below with reference to FIG. 2. FIG. 2 is a schematic diagram of an IC 200 that includes a 12-transistor, 4-wordline, latch-based memory cell 202, with broken feed-back writing. IC 200 further includes a memory controller 208 that controls write wordline W and $\overline{W}$, read wordlines R and $\overline{R}$, a write bitline D, and a read bitline Q. As described further below with reference to FIG. 14C, memory cell 202 encompasses 7 CPPs.

Memory cell 202 includes cross-coupled inverters 204 and 206. Inverter 206 is similar to inverter 106 of FIG. 1. Inverter 204 includes transistors P1 and N1 of inverter 104 in FIG. 1, and further includes a broken feedback circuit 214 that disables inverter 204 during write operations, as described further below. In the example of FIG. 2, broken feedback circuit 214 is depicted within inverter 204 (i.e., forming a stack), for illustrative purposes.

Memory cell 202 further includes a latch-based/buffered-read circuit (read circuit) 212 that isolates inverters 204 and 206 from read voltage bumps. Read circuit 212 includes read pass gate transistors N8 and P8, and buffer transistors N9 and P9. For a read operation, memory controller 208 pulls up readline R to VDD and pulls down readline $\overline{R}$ to VSS. If node C is logic 0, transistors P8 and P9 turn on and pull up read bitline Q to VDD. In this example, buffer transistor P9 isolates node C from read voltage bumps that may occur at a node 230. If node C is logic 1, transistors N8 and N9 turn on and pull down read bitline Q to VSS. In this example, buffer transistor N9 isolates node C from read voltage bumps that may occur at a node 232.

Memory cell 202 further includes a write circuit 210 that includes write gate transistors P10 and N10 that write bitline D to node T. For a write operation, memory controller 208 pulls up wordline W to VDD and pulls down wordline W̄ to VSS, which turns on write gate transistors P10 and N10. When write gate transistors P10 and N10 are on, write gate transistors P10 and N10 couple bitline D to node T.

To reduce or eliminate contention during write operations, broken feedback circuit 214 isolates node T from pull-up transistor P1 and pull-down transistor N1. In the example of FIG. 2, broken feedback circuit 214 includes a gate transistor N11 that de-couples pull-down transistor N1 from node T based on write line W, and a gate transistor P11 that de-couples pull-up transistor P1 from node T based on write line W̄. When write line W is pulled up to VDD for a write operation, gate transistor P11 turns off, which de-couples or isolates transistor P1 from node T (i.e., precludes transistor P1 from pulling up node T to VDD). Similarly, when write line W̄ is pulled down to VSS for the write operation, gate transistor N11 turns off, which de-couples or isolates transistor N1 from node T (i.e., precludes transistor N1 from pulling down node T to VSS). During the write operation, node T is driven only by gate transistors P10 and N10 and there is no contention when overwriting an existing state at node T.

Broken feedback circuit 214 reduces or eliminates sensitivity to device drive strength ratios, and buffered read circuit 212 reduces or eliminates sensitivity to read voltage bumps. Memory cell 202 may thus operate at lower voltages without compromising reliability/consistency, but at a cost of 4 additional transistors and an increase of 2 CPP, relative to memory cell 142.

Figure 3A:
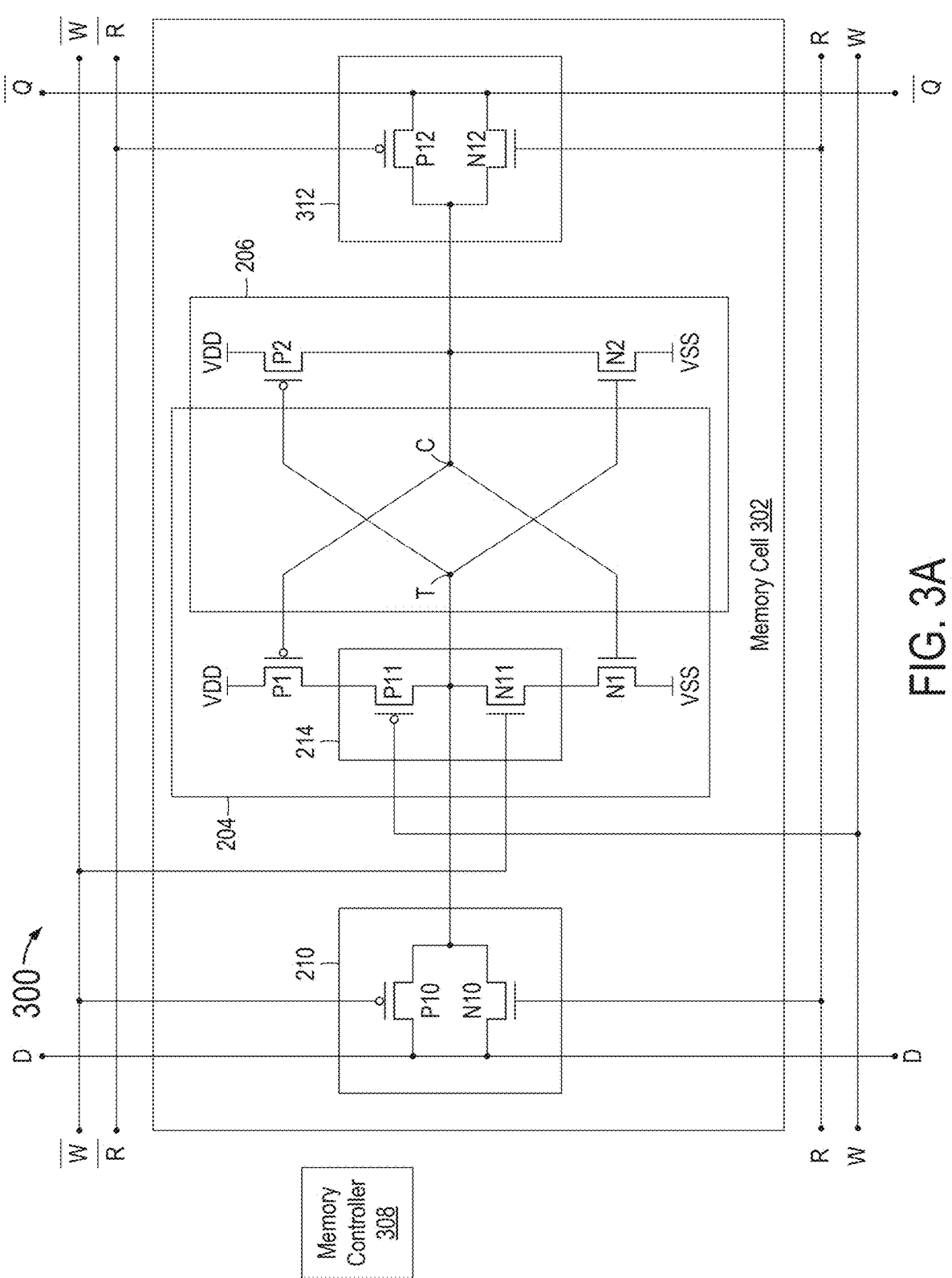
FIG. 3A is a schematic diagram of an IC that includes a 10-transistor, 4-wordline, latch-based memory cell with broken feedback write, and un-buffered read.

The transistor count of memory cell 202 may be reduced by eliminating read buffering circuitry, such as described below with reference to FIG. 3A. FIG. 3A is a schematic diagram of an IC 300 that includes a 10-transistor, 4-word-line memory cell 302. As described further below with reference to FIG. 14D, memory cell 302 encompasses may consume an area of 5 CPPs.

Memory cell 302 includes write circuit 210, inverters 204 and 206, and interrupt circuit 212, of memory cell 202. Memory cell 302 further includes a memory controller 308 that controls write wordlines W and W̄, read wordlines R and R̄, a write bitline D, and a read bitline Q̄. Memory cell 302 further includes un-buffered read circuit 312 that includes read pass gate transistors N12 and P12, that read node C to bitline Q̄ based on read wordlines R and R̄.

Figure 3B:
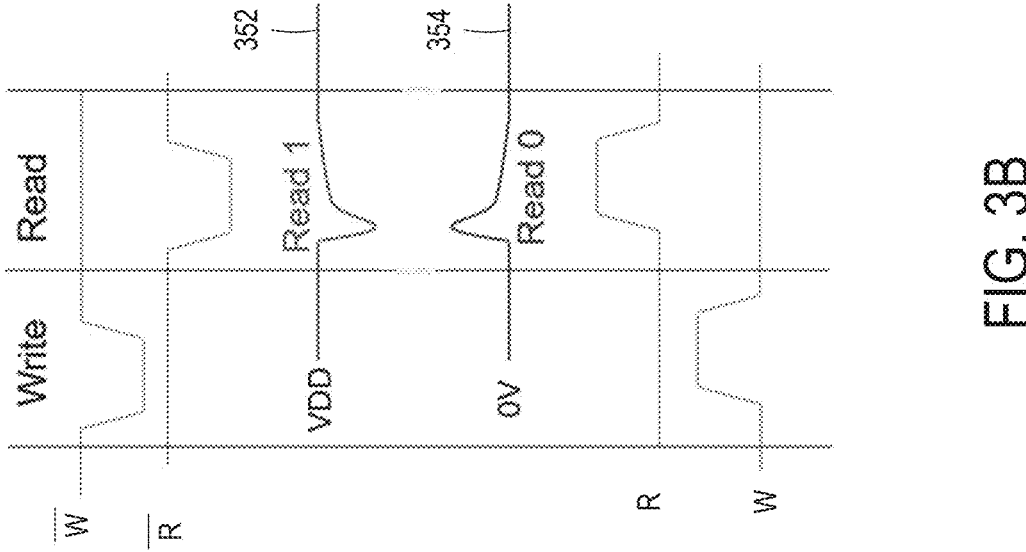
FIG. 3B illustrates timing diagrams for write wordlines W and $\overline{W}$ and read wordlines R and $\overline{R}$ of the IC of FIG. 3A, during write and read operations.

FIG. 3B illustrates timing diagrams 350 for write word-lines W and W̄ and read wordlines R and R̄, during write and read operations of IC 300. FIG. 3B further illustrates a read voltage bump 352 at node C when node C is logic 1, and a read voltage bump 354 at node C when node C is logic 0.

Figure 4:
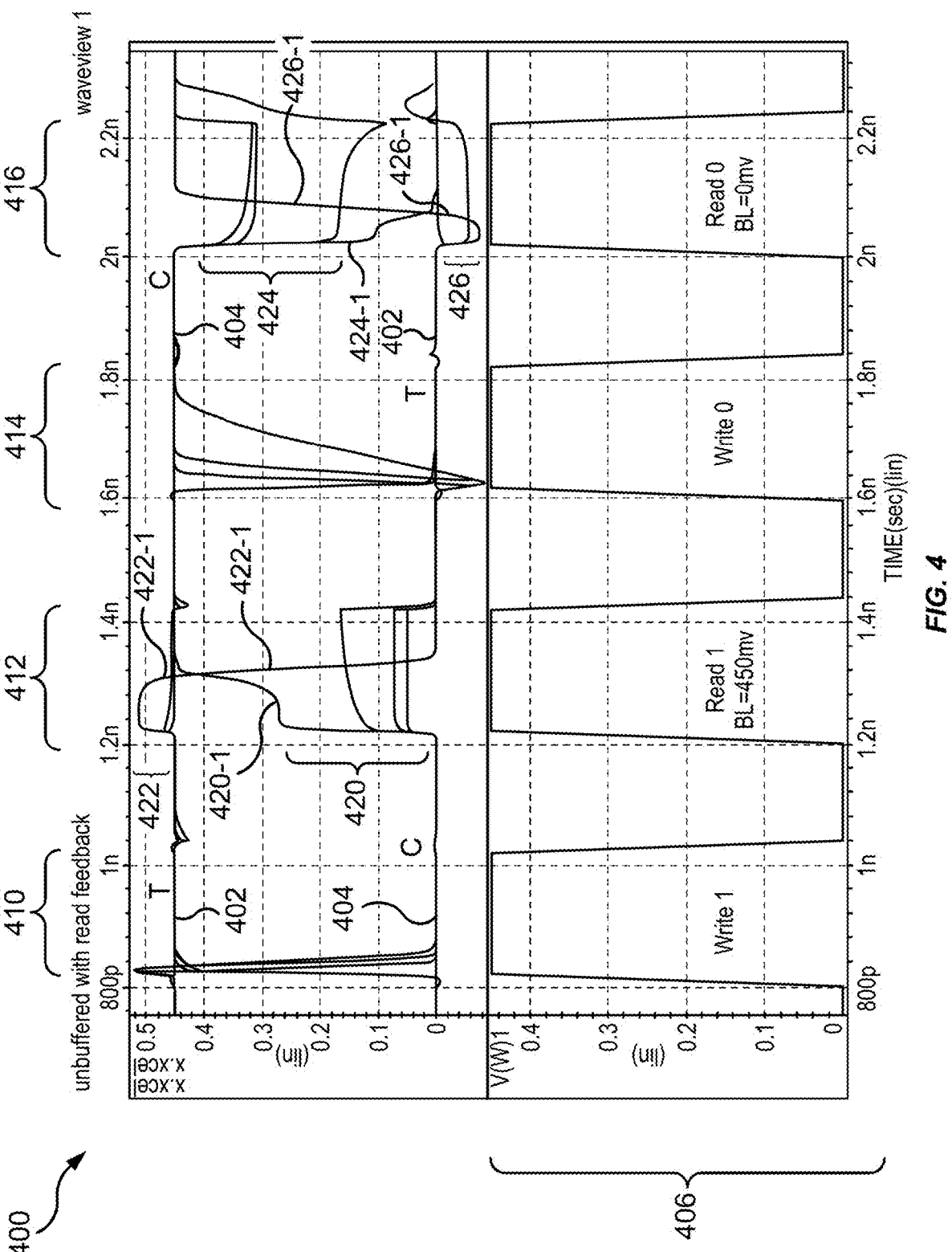
FIG. 4 illustrates simulated read and write timing diagrams for the IC of FIG. 3A, according to an embodiment.

FIG. 4 illustrates simulated read and write timing diagrams 400 for IC 300. Timing diagrams 400 are based on the following relative extreme conditions: Slow Process low temperature (−40c), low voltage (450 mV), and 6 Sigma device variation. Timing diagrams 400 include timing diagrams 402 for 4 different process variations of node T encompassing 6 sigma extremes. Timing diagrams 400 further include timing diagrams 404 for 4 different possible process variations of node C encompassing 6 sigma extremes. Timing diagrams 400 further include a clock timing diagram 406 annotated with the operation during that cycle. Timing diagrams 400 include time segments 410, 412, 414, and 416.

Segment 410 represents write operations in which write circuit 210 of FIG. 3 writes logic is to node T. Segment 412 represents read operations in which read circuit 312 reads corresponding logic 0s at node C. During segment 412, node C experiences read voltage bumps 420, and node T experiences corresponding read voltage bumps 422 due to capacitive coupling with node C. A read voltage bump 420-1 at node C and a corresponding read voltage bump 422-1 at node T result in a bit flip.

Segment 414 represents write operation in which write circuit 210 of FIG. 3 writes logic 0s to node T. Segment 416 represents a read operation in which read circuit 312 reads corresponding logic is at node C. During segment 416, node C experiences read voltage bumps 424, and node T experiences corresponding read voltage bumps 426. A read voltage bump 424-1 at node C and a corresponding read voltage bump 426-1 at node T result in a bit flip.

Simulated timing diagrams 400 artificially model extreme cases of bit-line capacitance by holding read bitline Q̄ at a data state opposite to that which is being read. In a physical circuit, voltage bumps are transient and reduce as the pre-charged read bitline (e.g., Q or Q̄) discharges.

As illustrated in FIG. 4, write operations of memory cell 302 are stable and reliable, more so when writing logic 0s, whereas read operations suffer from significant voltage bumps that sometimes result in bit flips. Memory cell 302 thus preserves the reduced write contention of latch-based memory cell 202, and reduces the transistor count to 10 (and reduces CPP to 5), but does not isolate node C from read voltage bumps. Memory cell 302 also does not support mask writing. Memory cell 302 could be modified to include additional transistors to provide mask writing, but at a cost of an additional CPP (i.e., for a total of 8 CPPs).

As described below, broken feedback circuit 214 may be re-purposed as a dynamic disturb reduction (DDR) circuit that alleviates impacts of read voltage bumps, with little or no increase in transistor count or CPP relative to memory cell 142. In examples presented below, an interrupt circuit disables at least a portion of a cross-coupled inverter during read operations to reduce and/or eliminate impacts of read disturb bumps. In some examples presented below, the interrupt circuit also disables at least a portion of a cross-coupled inverter during write operations to reduce or eliminate write contention.

Figure 5A:
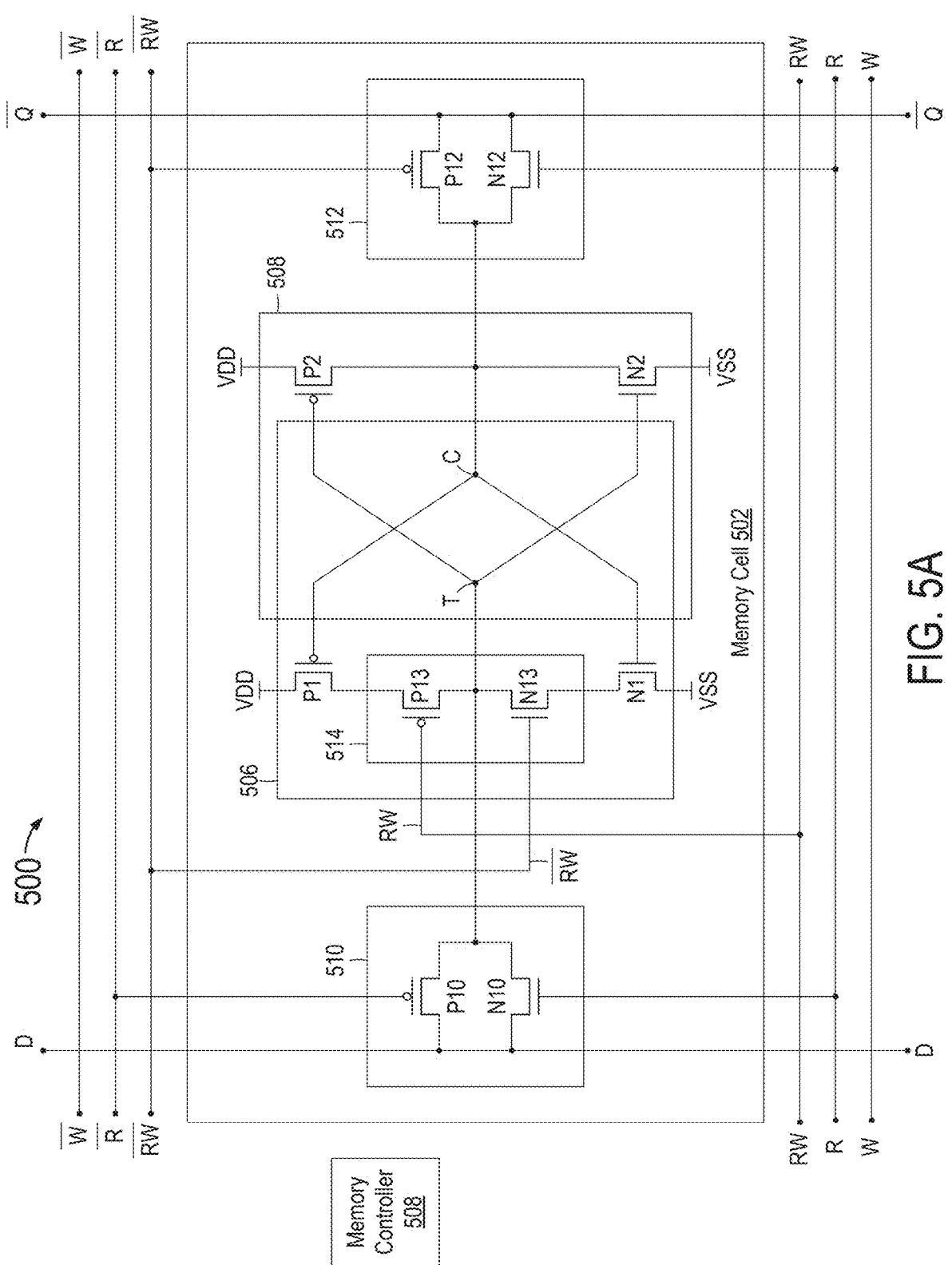
FIG. 5A is a schematic diagram of an IC that includes a 10-transistor, 6-wordline memory cell with broken feedback write and dynamic disturb reduction (DDR), according to an embodiment.

FIG. 5A is a schematic diagram of an IC 500 that includes a 10-transistor, 6-wordline memory cell 502 with broken feedback write and dynamic disturb reduction (DDR), according to an embodiment. Memory cell 502 includes transistors P1, N1, P2, and N2 arranged as cross-coupled inverters 506 and 508 having nodes T and C, such as described above with reference to memory cell 102. As described further below with reference to FIG. 14E, memory cell 502 encompasses 5 CPPs.

Memory cell 502 further includes a memory controller 508 that controls write wordlines W and W̄, read wordlines R and R̄, and read/write wordlines RW and R̄W̄. Read/write wordline RW may represent a logical OR of write wordline W and read wordline R. Read/write wordline R̄W̄ may represent a logical OR of write wordline W̄ and read wordline R̄. Memory cell 502 further includes a write circuit 510 that writes a bitline D to node T, such as described above with reference to write circuit 210 in FIG. 2. Memory cell 502 further includes an un-buffered read circuit 512 that reads node C to bitline Q, such as described above with reference to read circuit 312 in FIG. 3A.

Memory cell 502 further includes an interrupt circuit 514 that serves as a broken feedback write circuit and a dynamic disturb reduction (DDR) circuit. In the example of FIG. 5A, interrupt circuit 514 isolates node T from pull-up transistor P1 and pull-down transistor N1 during write operations and read operations. Interrupt circuit 514 includes a gate transistor N13 that de-couples pull-down transistor N1 from node T based on read/write line $\overline{RW}$, and a gate transistor P13 that de-couples pull-up transistor P1 from node T based on read/write line RW When read/write line RW is pulled up to VDD, gate transistor P13 turns off, which de-couples or isolates pull-up transistor P1 from node T. Similarly, when read/write line $\overline{RW}$ is pulled down to VSS, gate transistor N13 turns off, which de-couples or isolates transistor N1 from node T. Node T thus floats during write operations and during read operations. Floating node T during write operations reduces write contention, as described above with reference to broken feedback circuit 214 in FIG. 2. Floating node T during read operations prevents node T from flipping or changing state during read operations even when read voltage bumps occur on node C occur as described further above with reference to FIG. 4

Figure 5B:
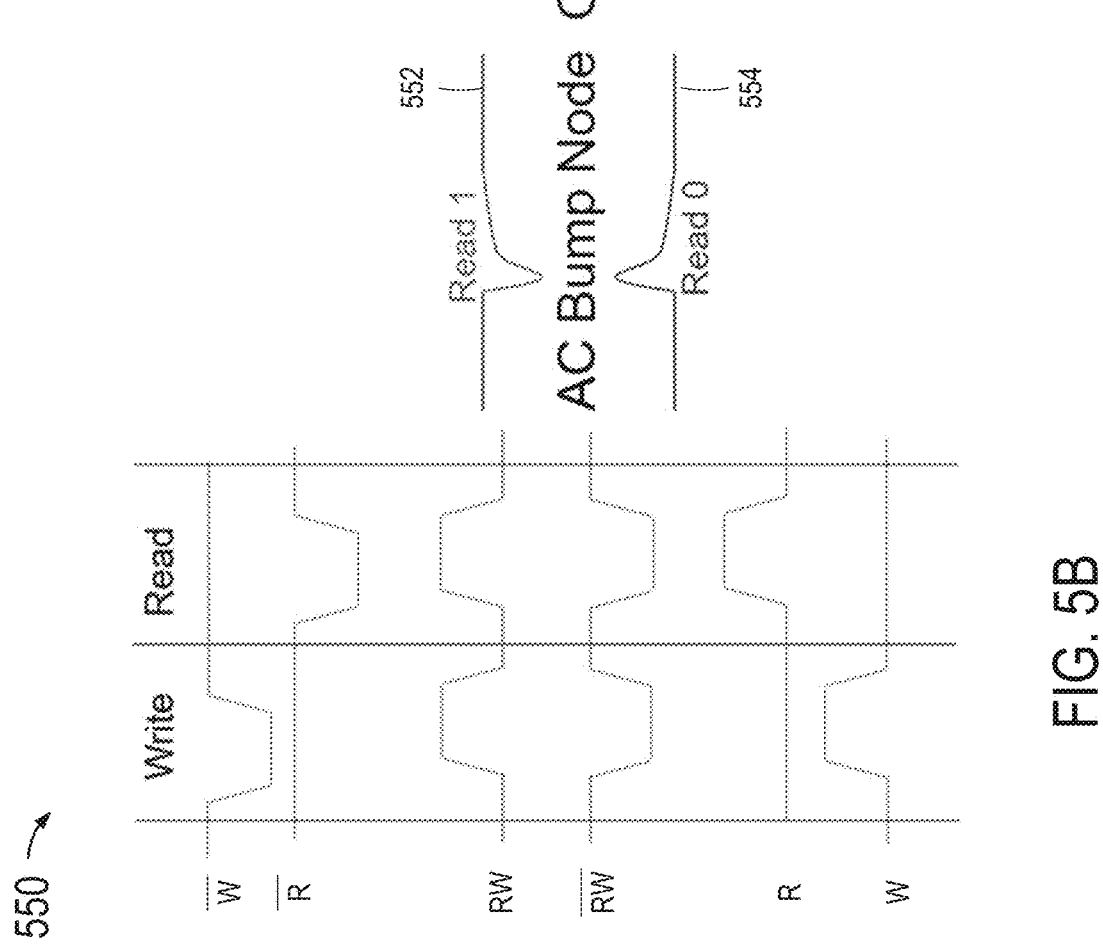
FIG. 5B illustrates timing diagrams for wordlines W, W, R, $\overline{R}$, RW and $\overline{RW}$ of the IC of FIG. 5A, for read and write operations, according to an embodiment.

FIG. 5B illustrates timing diagrams 550 for wordlines W, W, R, $\overline{R}$, RW and $\overline{RW}$ of IC 500, for read and write operations, according to an embodiment. FIG. 5B further illustrates a read voltage bump 552 at node C when node C is logic 1, and a read voltage bump 554 at node C when node C is logic 0.

Figure 6:
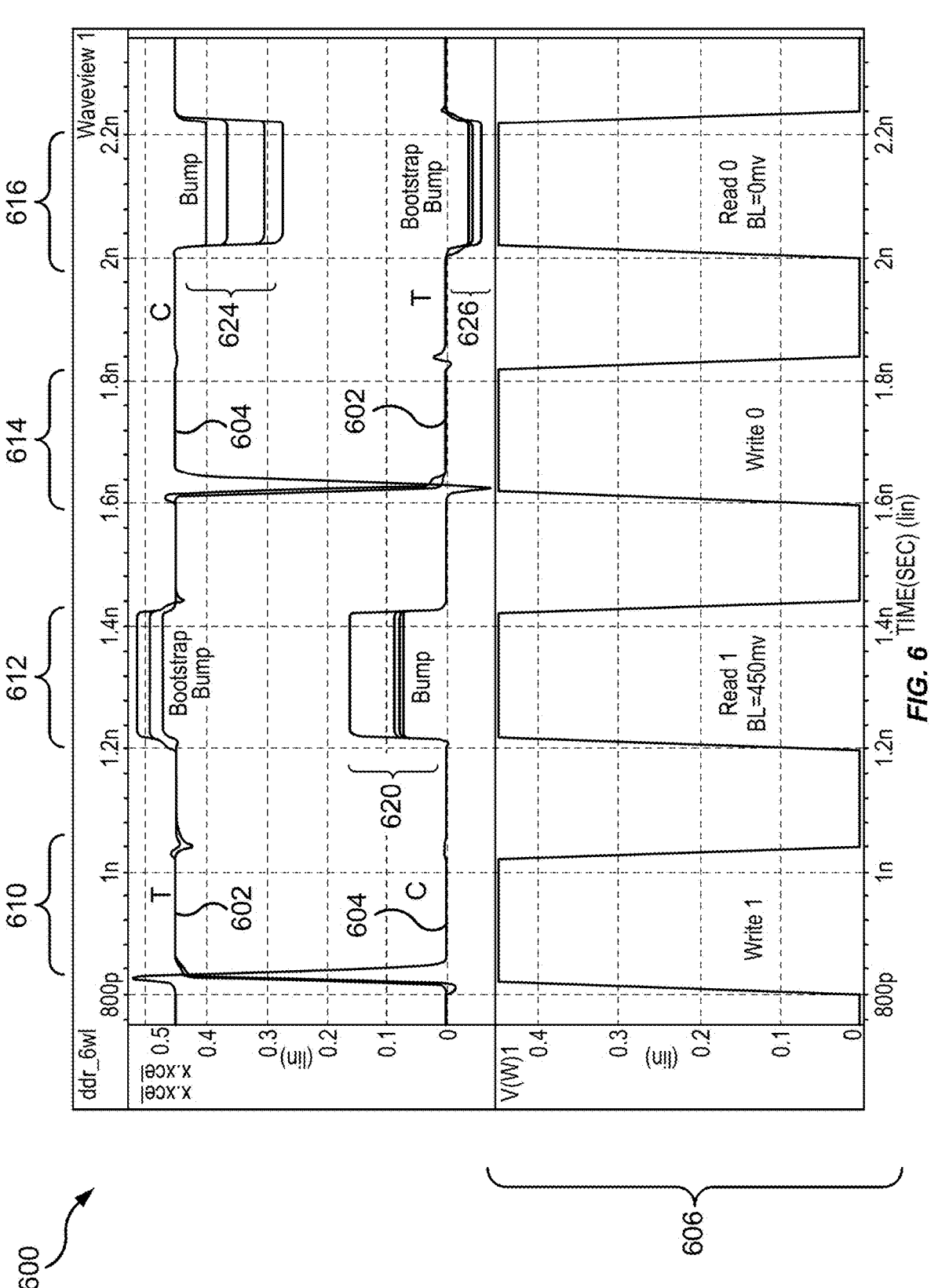
FIG. 6 depicts simulated timing diagrams for the IC of FIG. 5A, during write and read operations, according to an embodiment.

FIG. 6 depicts simulated timing diagrams 600 for IC 500, during write and read operations, according to an embodiment. Timing diagrams 600 include timing diagrams 602 for node T, timing diagrams 604 for node C, and a clock timing diagram 606. Timing diagrams 602 and 604 include timing diagrams for four different process variations of node T, encompassing 6 sigma extremes (i.e., Slow Process, low temperature (−40c), low voltage (450 mV), and 6 Sigma device variations). Timing diagrams 600 include time segments 610, 612, 614, and 616. Timing diagram 606 is annotated with information related to write and read operations of the respective time segments.

FIG. 6 illustrates simulated read and write timing diagrams 600 for IC 500, according to an embodiment. Timing diagrams 600 are based on the following conditions: Slow Process, low temperature (−40c), low voltage (450 mV), and 6 Sigma device variation. Timing diagrams 600 include timing diagrams 602 for 4 different process variations of node T encompassing 6 sigma extremes, timing diagrams 604 for 4 different possible process variations of node C encompassing 6 sigma extremes, and the clock timing diagram 606 annotated with the operation during that cycle. Timing diagrams 600 include time segments 610, 612, 614, and 616.

Segment 610 represents write operations in which write circuit 510 writes logic is to node T. Segment 612 represents read operations in which read circuit 512 reads corresponding logic 0s at node C. During segment 612, node C experiences read voltage bumps 620, and node T experiences corresponding bootstrap voltage bumps 622, which may be useful to increase a NFET read current through pull-down transistor N2.

Segment 614 represents write operations in which write circuit 510 writes logic 0s to node T. Segment 616 represents read operations in which read circuit 512 reads corresponding logic is at node C. During segment 616, node C experiences downward read voltage bumps 624, and node T experiences corresponding negative bootstrap voltage bumps 626, which may be useful to increase a PFET read current through pull-up transistor P2.

As illustrated in FIG. 6, bit flips do not occur because interrupt circuit 514 precludes feedback. In addition, bootstrap read voltage bumps at node T overdrive transistors P2 and N2 (i.e., increase Vgs), which helps to retain a current state of memory cell 502 during read operations and which helps to quickly drain bitline $\overline{Q}$. Memory cell 502 thus provides improves stability and reliability, at lower voltages, with little or no increase in area/CPPs, relative to memory cell 142 (and with 2 fewer CPPs relative to latch-based memory cell 202).

As with FIG. 4, simulated timing diagrams 600 artificially model extreme cases of bit-line capacitance by holding read bitline $\overline{Q}$ at a data state opposite to that which is being read. In a physical circuit, voltage bumps are transient and reduce as the pre-charged read bitline (e.g., Q or $\overline{Q}$) discharges.

Memory cell 502 may be modified with additional transistors to provide masked writing, at a cost of one additional CPP for a total of 6 CPP, which is below the 8 CPPs of latch-based memory cell 202 when modified for masked writing.

In the example of FIG. 5, node T floats during write operations and read operations, which may result in leakage current. As described below with reference to FIG. 7, leakage may be controlled or minimized by limiting the time which word-lines are active.

Figure 7:
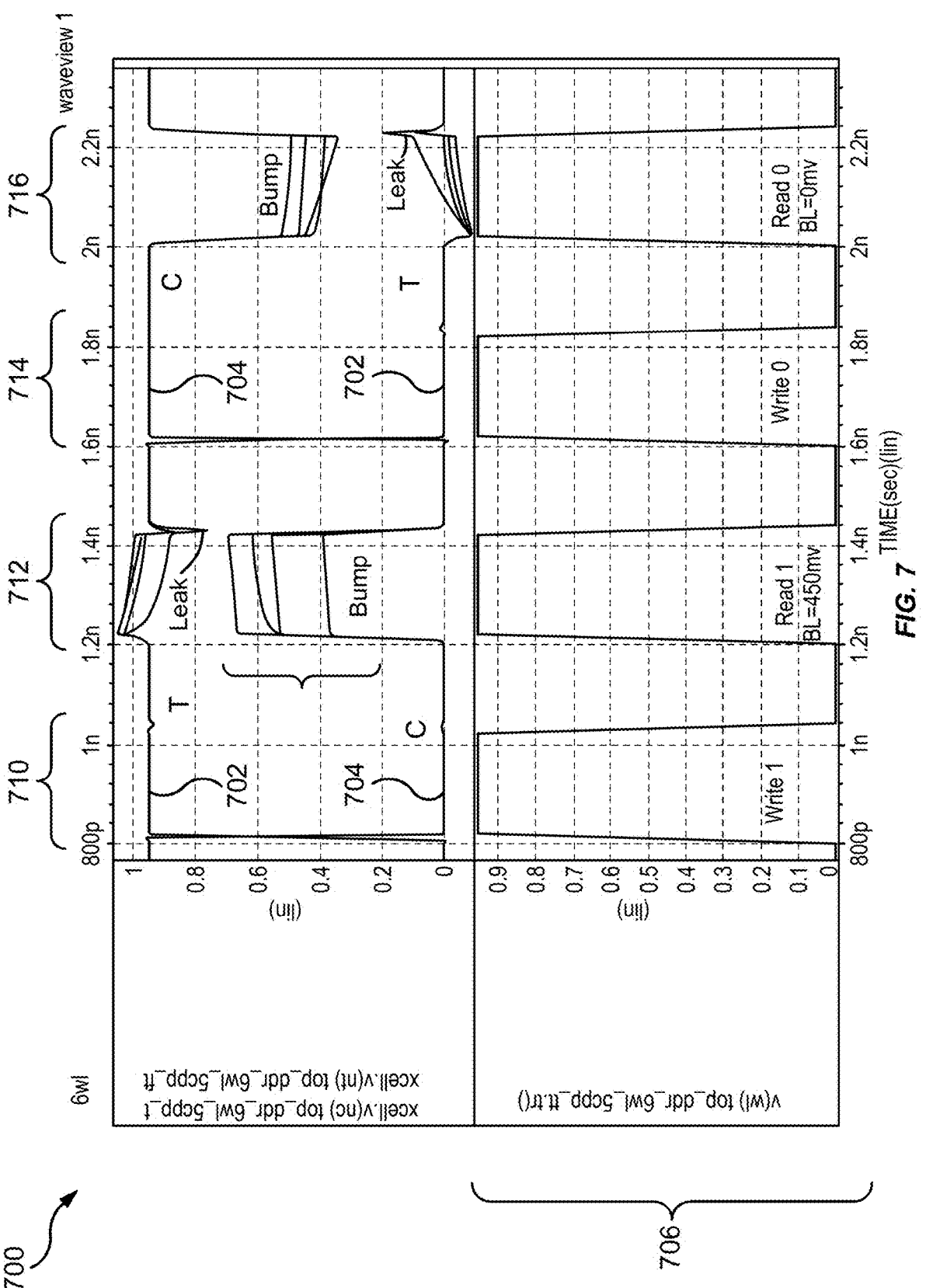
FIG. 7 illustrates simulated leakage timing diagrams for the IC of FIG. 5A, according to an embodiment.

FIG. 7 illustrates simulated leakage timing diagrams 700 for IC 500, according to an embodiment. Timing diagrams 700 are based on the following conditions: Fast process, high temperature (125c), high voltage (950 mV), and 6 sigma device variations to show worst case leakage. Timing diagrams 700 include timing diagrams 702 for 4 different process variations of node T encompassing 6 sigma extremes. Timing diagrams 700 further include timing diagrams 704 for 4 different possible process variations of node C encompassing 6 sigma extremes. Timing diagrams 700 further include a clock timing diagram 706 annotated with the operation during that cycle. Timing diagrams 704 shows leakage through transistors P1, P13, N13, and N1 (collectively referred to as a transistor stack), and leakage through write transistors P10 and N10. Given enough time, the voltage degradation will result in a cell flip. To avoid cell flip, the pulse width of read/write wordlines RW and $\overline{RW}$ may be controlled/limited to the time needed to sufficiently discharge read bitline Q or $\overline{Q}$.

Timing diagrams 700 include time segments 710, 712, 714, and 716. Segment 710 represents write operations in which write circuit 510 writes logic is to node T. Segment 712 represents read operations in which read circuit 512 reads corresponding logic 0s at node C. Segment 714 represents write operations in which write circuit 510 writes logic is to node T. Segment 716 represents read operations in which read circuit 512 reads logic is at node C. As illustrated in FIG. 7, there is no leakage during write operations (i.e., segments 710 and 714). There is some leakage during read operations (i.e., segments 712 and 716), but the leakage occurs within relatively short time frames and ends as wordlines RW and $\overline{RW}$ go inactive. Moreover, most of the leakage occurs through transistors P10 and N10 when node D is held at an opposite state as node T. Leakage through P13 and N13 will not substantially alter the node state because feedback transistors P1 and N1 are reinforcing the same state. For example, when Node T is logic 1, node C is logic 0, P1 is on and N1 is off. Leakage through P13 will help, while leakage through N13 may degrade a logic 1 at node. However, since N1 is off, the source node of transistor N13 will rise, creating a negative Vgs, which reduces leakage through N13 (e.g., by approximately 7×).

As illustrated in FIGS. 6 and 7, write operations and read operations of memory cell 502 are stable and reliable. Memory cell 502 thus reduces write contention and protects against read voltage bumps, at lower operating voltages, while reducing transistor count and CPPs by 2, relative to latch-based memory cell 202 in FIG. 2.

In the example of FIG. 5A, memory cell 502 uses two additional wordlines (i.e., read/write wordlines RW and $\overline{RW}$) relative to memory cell 202, plus OR logic to control read/write wordlines s RW and $\overline{RW}$, but also reduces loading on write wordlines W and $\overline{W}$. For example, in FIG. 5, each of wordlines W and $\overline{W}$ drive one gate per memory cell. In FIG. 2, each of wordlines for wordlines W and $\overline{W}$ drive two gates. IC 500 may thus use relatively weak row drivers for wordlines W, $\overline{W}$, RW and $\overline{RW}$, such that there is relatively little or no net increase in area.

In some situations, it may be desirable to use fewer wordlines. For example, if a manufacturing/fabrication technology provides only 1 wiring track per poly gate, it may be challenging to wire memory cell 502 for 6 wordlines using the wiring tracks of 5 CPPs. Embodiments that use fewer wordlines are provided below.

Figure 8A:
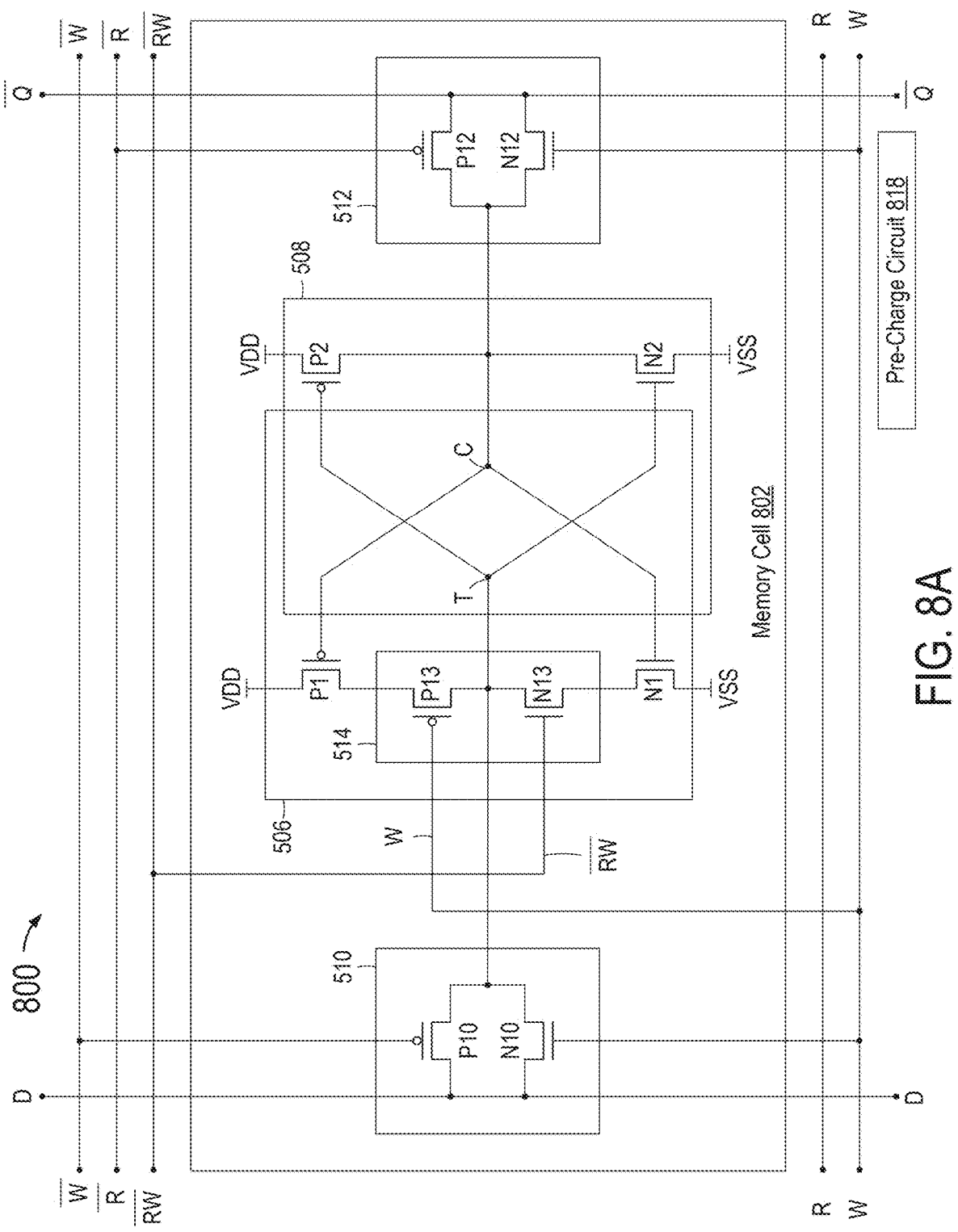
FIG. 8A is a schematic diagram of an IC that includes a 10-transistor, 5-wordline memory cell with broken feedback write and DDR, according to an embodiment.

FIG. 8A is a schematic diagram of an IC 800 that includes a 10-transistor, 5-wordline memory cell 802, with broken feedback write and DDR, according to an embodiment. As described further below with reference to FIG. 14F, memory cell 502 encompasses 5 CPPs.

Memory cell 802 is similar to memory cell 502, with the following exceptions. In FIG. 8A, and transistor P13 of interrupt circuit 514 is controlled by write wordline W rather than read/write wordline $\overline{RW}$, read/write wording $\overline{RW}$ is omitted, and IC 800 further includes a pre-charge circuit 818 that pre-charges bitline $\overline{Q}$ to VDD prior to read operations. Reducing the number of wordlines from 6 to 5 may be useful for wiring purposes, as described further above.

In the example of FIG. 8A, during write operations, transistors P13 and N13 are disabled, such as described in examples above. During read operations, transistor N13 is disabled and transistor P13 is enabled. When reading logic 1 at node C, pre-charged bitline Q and node C are at the same voltage (i.e., VDD). In this situation, read bumps do not occur at node C, as described in examples further above. When reading logic 0 at node C, read voltage bumps may arise at node C, but node T floats such that transistors P2 and N2 are unaffected by read voltage bumps. Moreover, a read voltage bump at note T may actually reinforce existing states of transistors P2 and N2, as described below with reference to FIG. 9. In another example, during read operations, transistor P13 may be disabled, transistor N13 may be enabled, and pre-charge circuit 818 may pre-charge bitline $\overline{Q}$ to VSS.

Figure 8B:
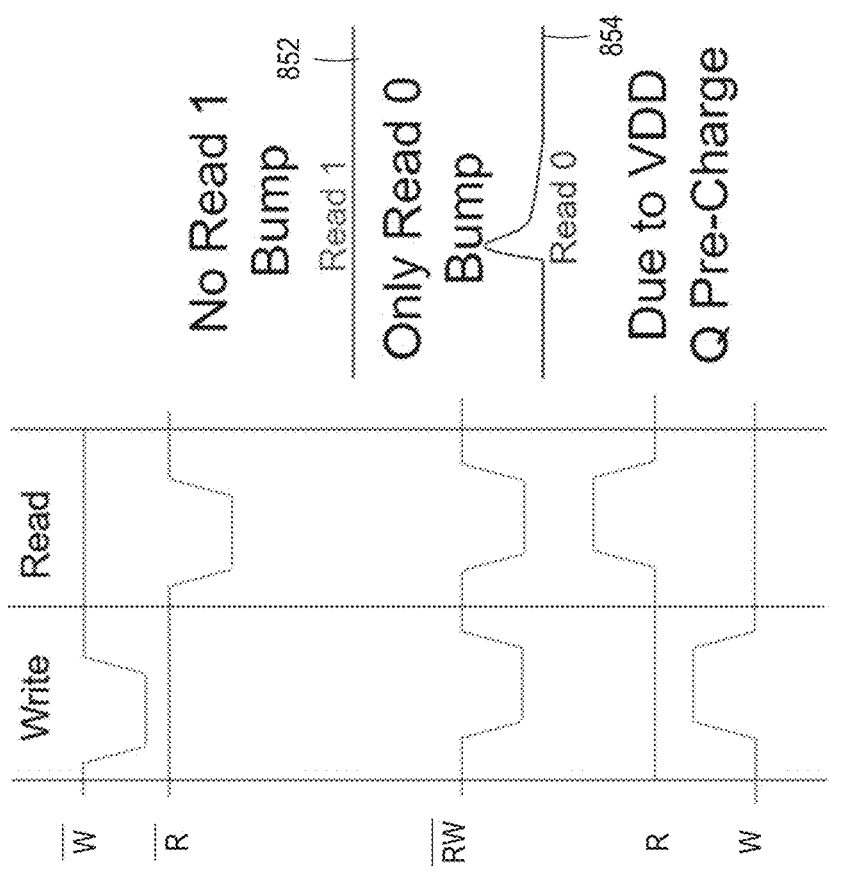
FIG. 8B illustrates timing diagrams 850 for wordlines W, $\overline{W}$, R, $\overline{R}$, and $\overline{RW}$ of the IC of FIG. 8A, for read and write operations, according to an embodiment.

FIG. 8B illustrates timing diagrams 850 for wordlines W, $\overline{W}$, R, $\overline{R}$, and $\overline{RW}$ of IC 800, for read and write operations, according to an embodiment. In FIG. 8B, node C experiences read voltage bumps 854 when node C is logic 0 (due to pre-charging bitline Q). Node C does not experience read voltage bumps when node C, 852, is logic 1.

Figure 9:
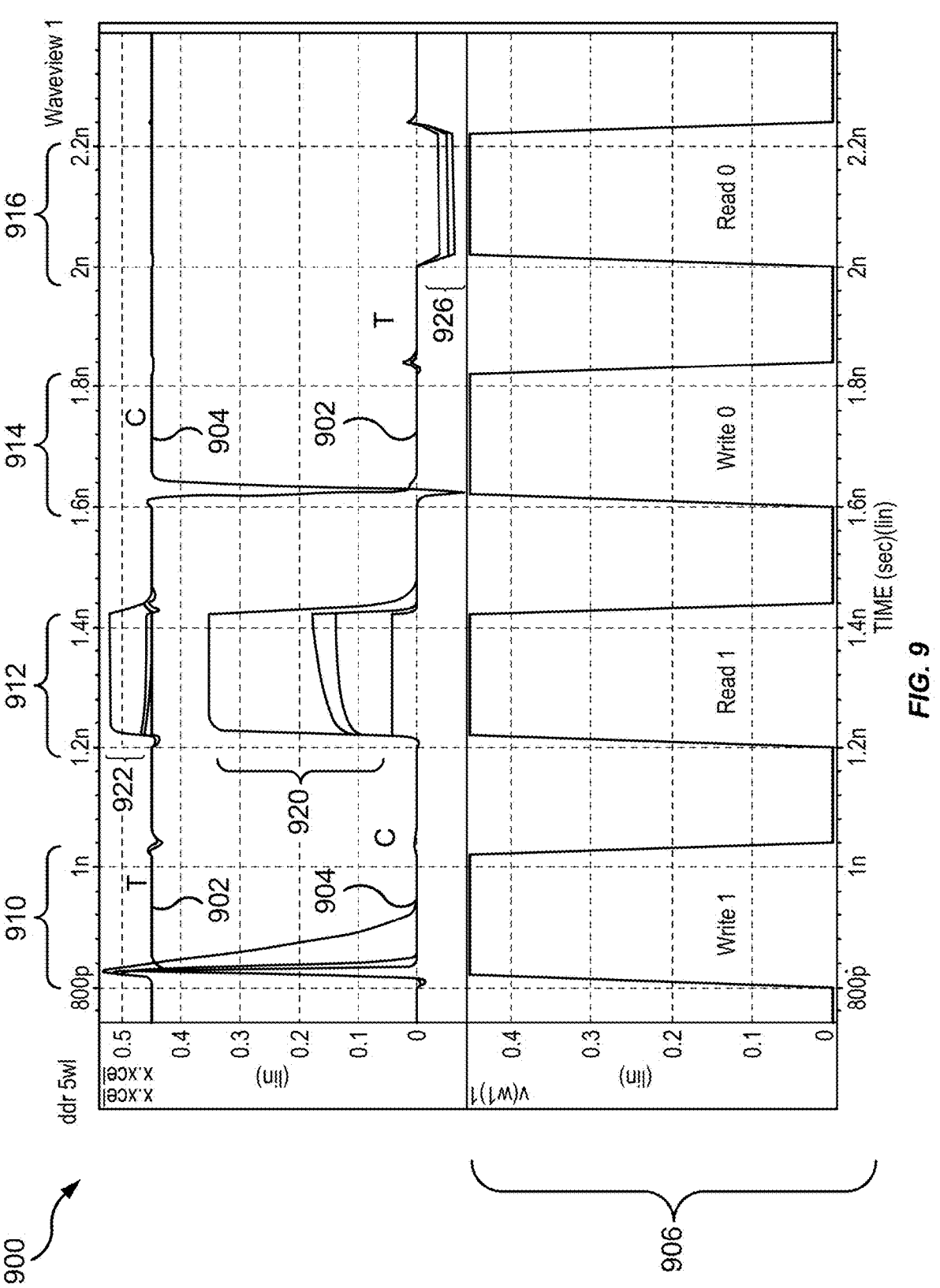
FIG. 9 illustrates simulated read and write timing diagrams for the IC of FIG. 8A, according to an embodiment.

FIG. 9 illustrates simulated read and write timing diagrams 900 for IC 800, according to an embodiment. Timing diagrams 900 are based on the following conditions: Slow Process, low temperature (−40c), low voltage (450 mV), and 6 Sigma device variation. Timing diagrams 900 include timing diagrams 902 for 4 different process variations of node T encompassing 9 sigma extremes, timing diagrams 904 for 4 different possible process variations of node C encompassing 6 sigma extremes, and the clock timing diagram 906 annotated with the operation during that cycle. Timing diagrams 900 include time segments 910, 912, 914, and 916.

Segment 910 represents write operations in which write circuit 510 writes logic is to node T. Segment 912 represents read operations in which read circuit 512 reads corresponding logic 0s at node C. During segment 912, node C experiences read voltage bumps 920, and node T experiences corresponding read voltage bumps 922, without flipping to a logic state 0. Moreover, read voltage bumps 922 may increase a NFET read current through pull-down transistor N2.

Segment 914 represents write operations in which write circuit 510 writes logic 0s to node T. Segment 916 represents read operations in which read circuit 512 reads corresponding logic is at node C. During segment 916, node C does not experience read voltage bumps, and node T experiences bootstrap voltage bumps 920.

Figure 10:
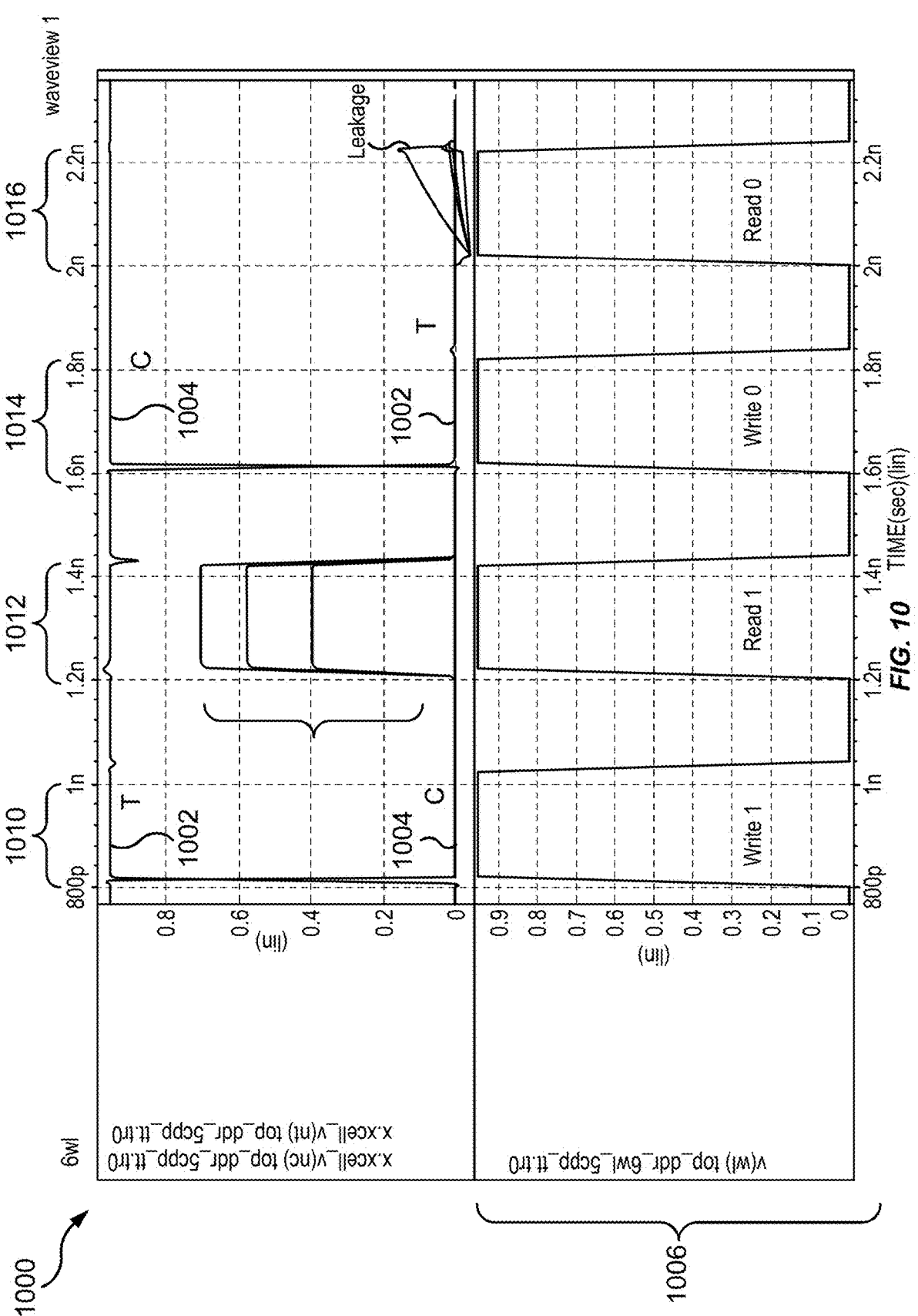
FIG. 10 illustrates simulated leakage timing diagrams for the IC of FIG. 8A, according to an embodiment.

FIG. 10 illustrates simulated leakage timing diagrams 1000 for IC 800, according to an embodiment. Timing diagrams 1000 are based on the following conditions: Fast process, high temperature (125c), high voltage (950 mV), and 6 sigma device variations to show worst case leakage. Timing diagrams 1000 include timing diagrams 1002 for 4 different process variations of node T encompassing 6 sigma extremes. Timing diagrams 1000 further include timing diagrams 1004 for 4 different possible process variations of node C encompassing 6 sigma extremes. Timing diagrams 1000 further include a clock timing diagram 1006 annotated with the operation during that cycle. Timing diagrams 1004 shows leakage through transistors P1, P13, N13, and N1 (collectively referred to as a transistor stack), and leakage through write transistors P10 and N10. Given enough time, the voltage degradation will result in a cell flip. To avoid cell flip, the pulse width of read/write wordline $\overline{RW}$ may be controlled/limited to the time needed to sufficiently discharge read bitline Q or $\overline{Q}$.

Timing diagrams 1000 include time segments 1010, 1012, 1014, and 1016. Segment 1010 represents write operations in which write circuit 510 writes logic is to node T. Segment 1012 represents read operations in which read circuit 512 reads corresponding logic 0s at node C. Segment 1014 represents write operations in which write circuit 510 writes logic 0s to node T. Segment 1016 represents read operations in which read circuit 512 reads corresponding logic is at node C. As illustrated in FIG. 10, there is no leakage during write operations (i.e., segments 1010 and 1014), and no leakage when reading logic 0s at node C (i.e., segment 1012). There is some leakage when reading logic 1s (i.e., segment 1016), but the leakage occurs within relatively short time frames and ends as wordline $\overline{RW}$ goes inactive.

Figure 11A:
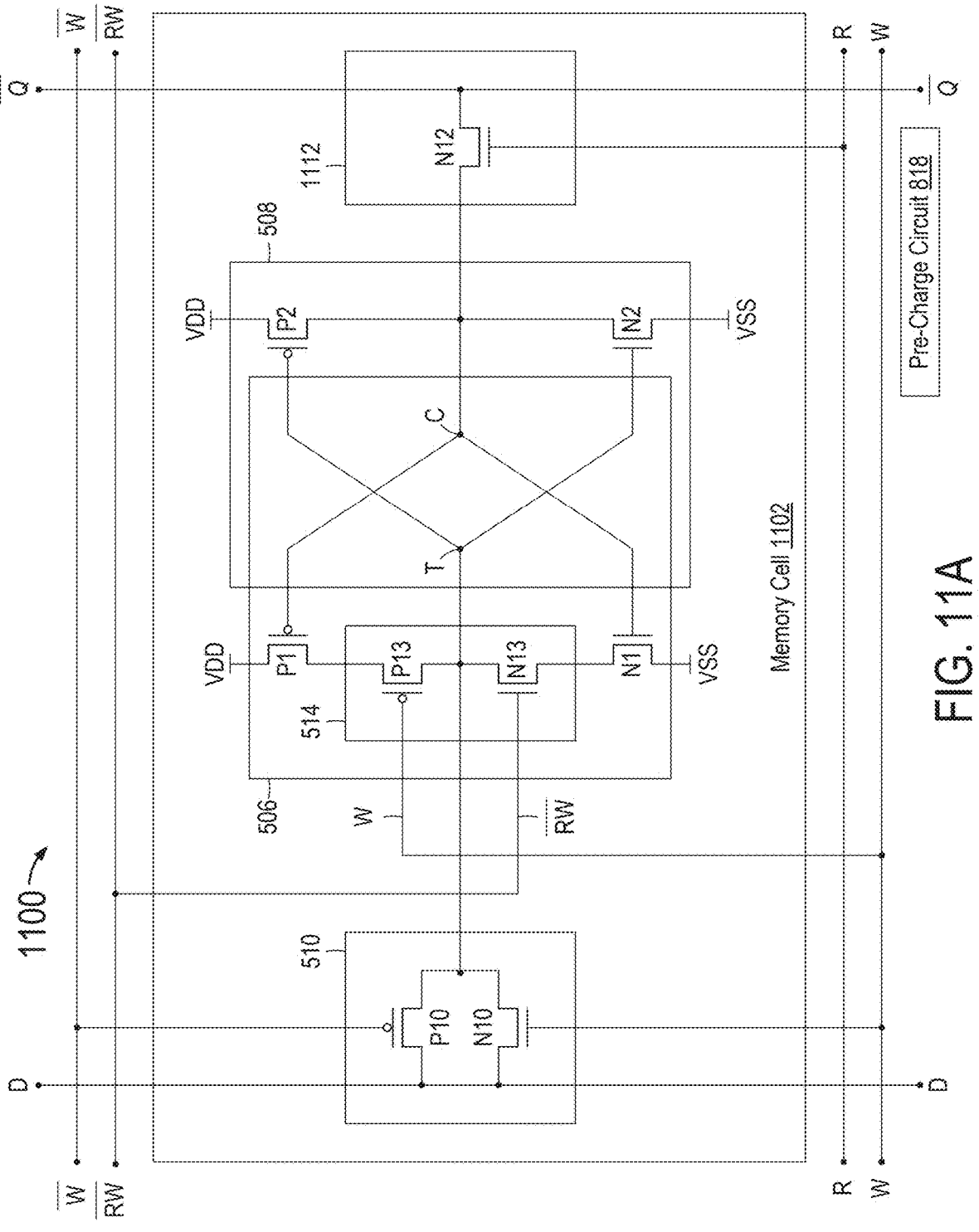
FIG. 11A is a schematic diagram of an IC that includes a 9-transistor, 4-wordline memory cell with broken feedback write and DDR, according to an embodiment.

FIG. 11A is a schematic diagram of an IC 1100 that includes a 9-transistor, 4-wordline memory cell 1102, with broken feedback write and DDR, according to an embodiment. As described further below with reference to FIG. 14G, memory cell 1102 encompasses 5 CPPs.

Memory cell 1102 is similar to memory cell 802, except that memory cell 1102 includes read circuit 1112 that is that is controlled by a single read wordline R (i.e., transistor P12 and read wordline $\overline{R}$ of FIG. 8A are omitted in FIG. 11A). Memory cell 1102 thus reduces the number of wordlines to 4, while maintaining broken feedback writing and DDR, with a 5-CPP footprint.

Figure 11B:
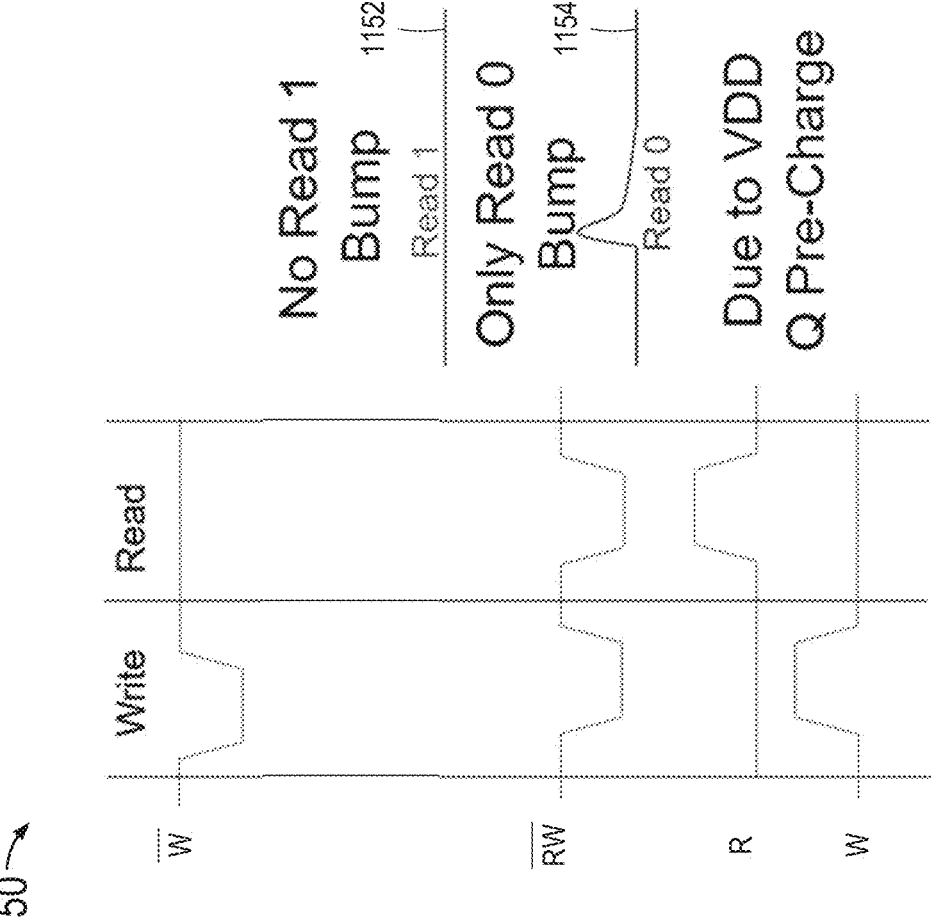
FIG. 11B illustrates timing diagrams for wordlines W, $\overline{W}$, R and $\overline{RW}$ of the IC of FIG. 11A, for read and write operations, according to an embodiment.

FIG. 11B illustrates timing diagrams 1150 for wordlines W, $\overline{W}$, R and $\overline{RW}$ of IC 1100, for read and write operations, according to an embodiment. In FIG. 11B, node C experiences read voltage bumps 1154 at 1154 when node C is logic 0, but not at 1152 when node C is logic 1. When node C is logic 0, interrupt circuit 514 breaks the feedback (i.e., node T floats), such that read voltage bumps/noise does not propagate, and logic states at node T does not flip.

Additional examples are provided below for masked writing.

Figure 12A:
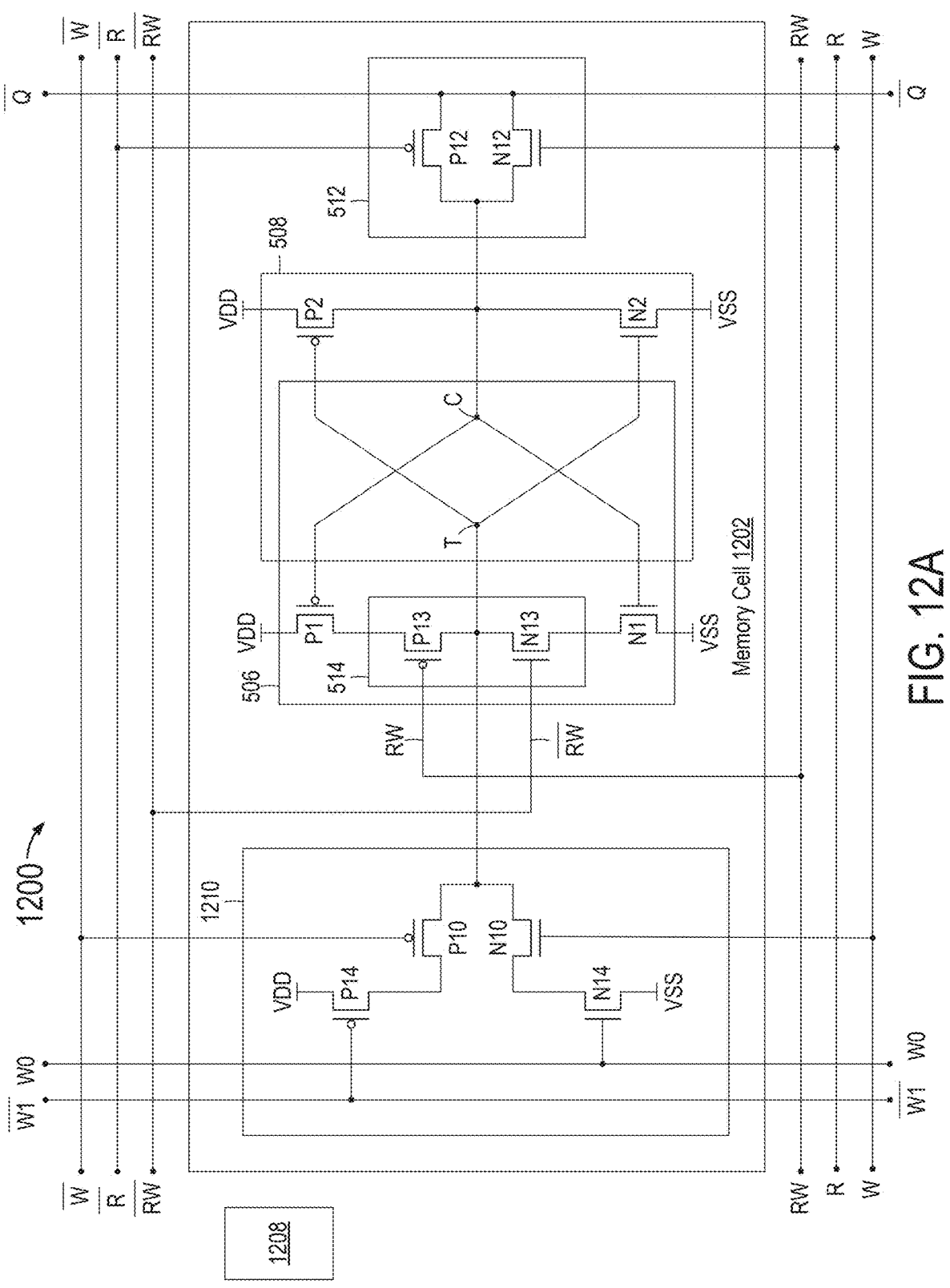
FIG. 12A is a schematic diagram of an IC that includes a 12-transistor, 6-wordline memory cell with broken feedback writing, DDR, and masked writing, according to an embodiment.

FIG. 12A is a schematic diagram of an IC 1200 that includes a 12-transistor, 6-wordline memory cell 1202, with broken feedback writing, DDR, and masked writing, according to an embodiment. As described further below with reference to FIG. 14H, memory cell 1202 encompasses 6 CPPs. Memory cell 1202 is similar to memory cell 502 in FIG. 5A, except that memory cell 1202 includes a write circuit 1210 that supports masked writing. Write circuit 1210 includes gate transistors P10 and N10, as described further above with reference to FIG. 5A. Write circuit 1210 further includes mask transistors P14 and N14. Mask transistor P14 is controlled by a write bitline $\overline{W1}$. Mask transistor N14 is controlled by a write bitline W0. A memory controller (not shown in FIG. 11A), controls write bitlines $\overline{W1}$ and W0 as illustrated in Truth Table 1 below.

Truth Table 1

| | $\overline{W1}$ | W0 |
| --- | --- | --- |
| Write 0 | 1 | 1 |
| Write 1 | 0 | 0 |
| Mask | 1 | 0 |

Figure 12B:
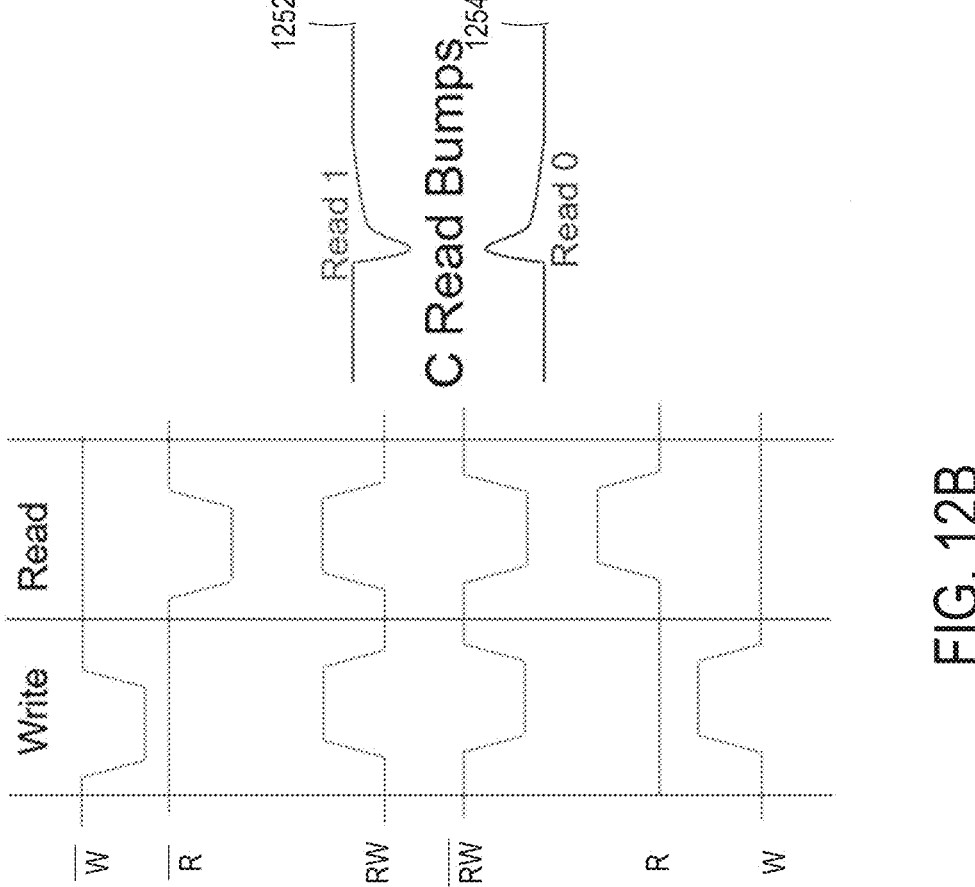
FIG. 12B illustrates timing diagrams for write wordlines W, $\overline{W}$, R, $\overline{R}$, RW, and $\overline{RW}$, of the IC of FIG. 12A, for read and write operations, according to an embodiment.

FIG. 12B illustrates timing diagrams 1250 for write wordlines W, $\overline{W}$, R, $\overline{R}$, RW, and $\overline{RW}$, of IC 1200, for read and write operations, according to an embodiment. In FIG. 12B, node C experiences read voltage bumps 1252 when node C is logic 1, and read voltage bumps 1254 when node C is logic 0.

Figure 13A:
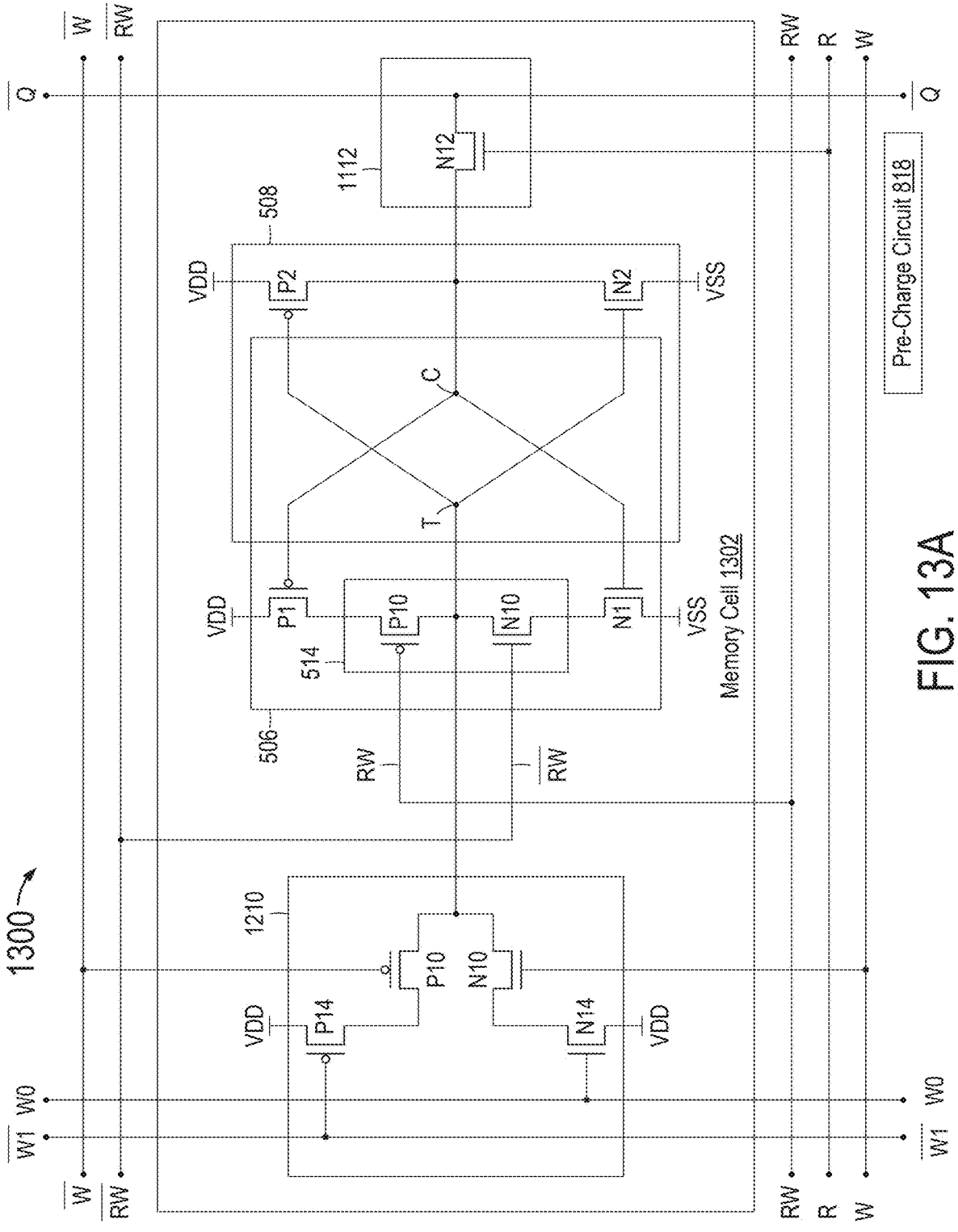
FIG. 13A is a schematic diagram of an IC that includes a 12-transistor, 5-wordline memory cell with broken feedback writing, DDR, and masked writing, according to an embodiment.

FIG. 13A is a schematic diagram of an IC 1300 that includes an 11-transistor, 5-wordline memory cell 1302, with broken feedback writing, DDR, and masked writing, according to an embodiment. As described further below with reference to FIG. 14I, memory cell 1302 encompasses 6 CPPs.

Memory cell 1302 is similar to memory cell 1202 in FIG. 12A, except that memory cell 1302 includes read circuit 1112 and pre-charge circuit 818 of IC 1100 in FIG. 11A. Memory cell 1302 thus reduces the number of wordlines to 5, while maintaining broken feedback writing, DDR, and masked writing, with a 6-CPP footprint.

Figure 13B:
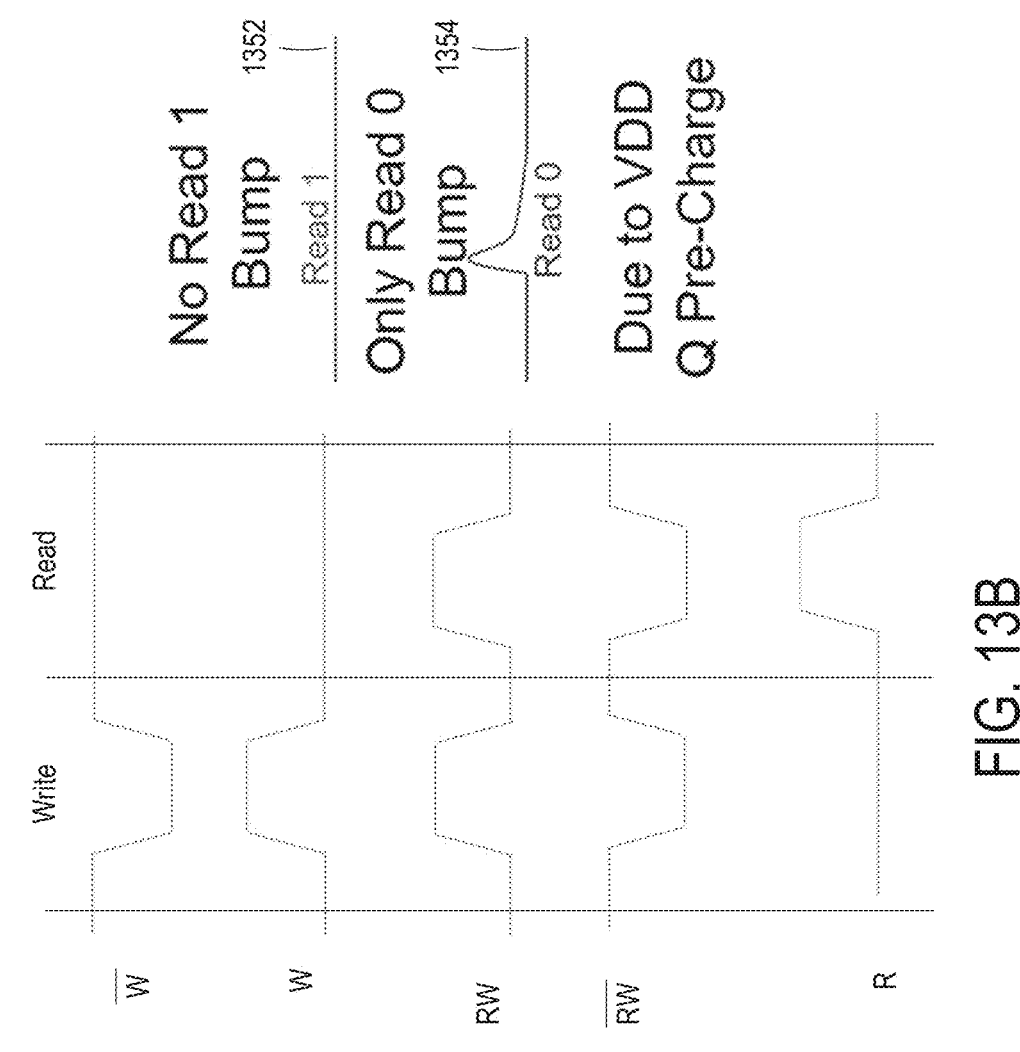
FIG. 13B illustrates timing diagrams for wordlines W, $\overline{W}$, R, RW, and $\overline{RW}$ of the IC of FIG. 13A, during read and write operations, according to an embodiment.

FIG. 13B illustrates timing diagrams 1350 for wordlines W, $\overline{W}$, R, RW, and $\overline{RW}$ of IC 1200, during read and write operations, according to an embodiment. In FIG. 13B, node C does not experience read voltage bumps. In FIG. 13B, node C experiences read voltage bumps at 1354 when node C is logic 0, but not at 1352 when node C is logic 1. When node C is logic 0, interrupt circuit 514 breaks the feedback (i.e., node T floats), such that read voltage bumps/noise does not propagate, and logic states at node T does not flip.

FIGS. 14A through 14I illustrate physical cell representations of memory cells presented in the foregoing examples, according to an embodiment. In FIGS. 14A through 14I, the notation "G" represents VSS, and the notation "V" represent VDD. A row is defined as an NFET/PFET pair of transistors. Thin cell configurations are characterized by occupying only 2 CPP across multiple rows, while wide cell configurations are characterized by occupying more than 2 CPP.

FIG. 14A illustrates a double row thin cell representation 1402 of memory cell 102 in FIG. 1A. As described further above, memory cell 103 is a single-port, 6-transistor memory cell that does not provide broken feedback writing, DDR, or masked writing. Thin cell representation 1402 encompasses 2 polygates over two rows of an IC, where each row includes an NFET channel and a PFET channel. Thin cell representation 1402 is thus equivalent to one row of 4 CPPs.

FIG. 14B illustrates a 2.5 row thin cell representation 1404 of memory cell 142 in FIG. 1B. As described further above, memory cell 142 is a 2-port, 8-transistor memory cell that provides a measure of read buffering, but does not provide broken feedback writing, DDR, and has an elevated disturb hazard during masked writing. Thin cell representation 1404 encompasses 2 polygates over two and one-half rows of an IC, where each of the two rows include an NFET channel and a PFET channel, and the half-row includes an NFET channel. Thin cell representation 1404 is thus equivalent to one row of 5 CPPs.

FIG. 14C illustrates a single row wide cell representation 1406 of memory cell 202 in FIG. 2, according to an embodiment. As described further above, memory cell 202 is a 12-transistor, latch-based memory cell that provides broken feedback writing but does not provide DDR or masked writing. Wide cell representation 1406 encompasses 7 polygates of one row of an IC (i.e., 6 polygates used for memory cell 202, plus a diffusion break 1407 to separate nodes T and C). Wide cell representation 1406 is thus equivalent to 7 CPPs.

FIG. 14D illustrates a single row wide cell representation 1408 of memory cell 302 in FIG. 3A, according to an embodiment. As described further above, memory cell 302 is a 10-transistor memory cell that provides broken feedback writing, but does not provide DDR or masked writing. Wide cell representation 1408 encompasses 5 polygates of one row of an IC. Wide cell representation 1408 is thus equivalent to 5 CPPs.

Figures 14E, 14F, 14G, 14H, 14I:
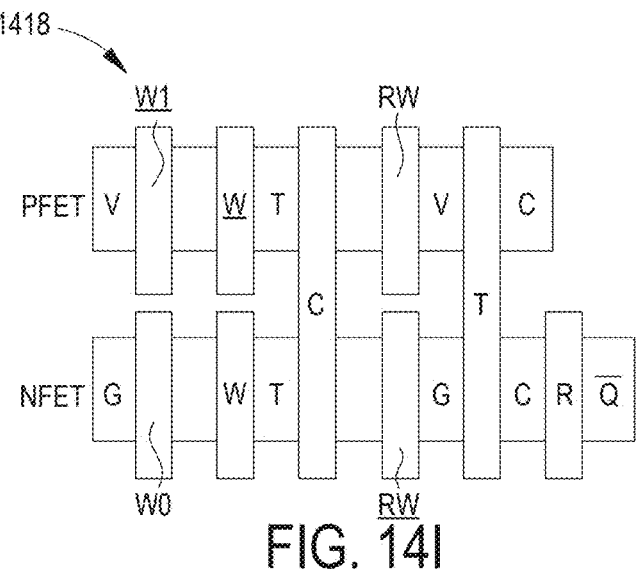

FIG. 14E illustrates a single row wide cell representation 1410 of memory cell 502 in FIG. 5A, according to an embodiment. As described further above, memory cell 502 is a 10-transistor memory cell that provides broken feedback writing and DDR, using 6 wordlines. Wide cell representation 1410 encompasses 5 polygates of one row of an IC. Wide cell representation 1410 is thus equivalent to 5 CPPs.

FIG. 14F illustrates a single row wide cell representation 1412 of memory cell 802 in FIG. 8A, according to an embodiment. As described further above, memory cell 802 is a 10-transistor memory cell that provides broken feedback writing and DDR, using 5 wordlines and pre-charging. Wide cell representation 1412 encompasses 5 polygates of one row of an IC. Wide cell representation 1408 is thus equivalent to 5 CPPs.

FIG. 14G illustrates a single row wide cell representation 1414 of memory cell 1102 in FIG. 11A, according to an embodiment. As described further above, memory cell 1102 is a 9-transistor memory cell that provides broken feedback writing and DDR, using 4 wordlines and pre-charging. Wide cell representation 1414 encompasses 5 polygates of one row of an IC. Wide cell representation 1414 is thus equivalent to 5 CPPs.

FIG. 14H illustrates a single row wide cell representation 1416 of memory cell 1202 in FIG. 12A, according to an embodiment. As described further above, memory cell 1202 is a 12-transistor memory cell that provides broken feedback writing, DDR, and masked writing, using 6 wordlines. Wide cell representation 1416 encompasses 6 polygates of one row of an IC. Wide cell representation 1416 is thus equivalent to 6 CPPs.

FIG. 14I illustrates a single row wide cell representation 1418 of memory cell 1302 in FIG. 13A, according to an embodiment. As described further above, memory cell 1302 is a 12-transistor memory cell that provides broken feedback writing, DDR, and masked writing, using 5 wordlines. Wide cell representation 1418 encompasses 6 polygates of one row of an IC. Wide cell representation 1418 is thus equivalent to 6 CPPs.

Additional examples are provided below.

In an example, a memory cell with dynamic disturb reduction includes first and second inverters in a cross-coupled arrangement, a write circuit to write to the memory cell, a read circuit to read the memory cell, and an interrupt circuit to disable at least a portion of the first inverter when the read circuit reads the memory cell.

In another example, a system includes a memory controller and an array of memory cells, each including first and second inverters in a cross-coupled arrangement, a write circuit to write to the memory cell, a read circuit to read the memory cell, and an interrupt circuit to disable at least a portion of the first inverter when the read circuit reads the memory cell.

In another example, a non-transistory computer readable medium is encoded with instructions (i.e., a computer program), which when executed by a processor, cause the processor to synthesize a memory cell of a circuit design to include first and second inverters in a cross-coupled arrangement, a write circuit to write to the memory cell, a read circuit to read the memory cell, and an interrupt circuit to disable at least a portion of the first inverter when the read circuit reads the memory cell.

Figure 15:
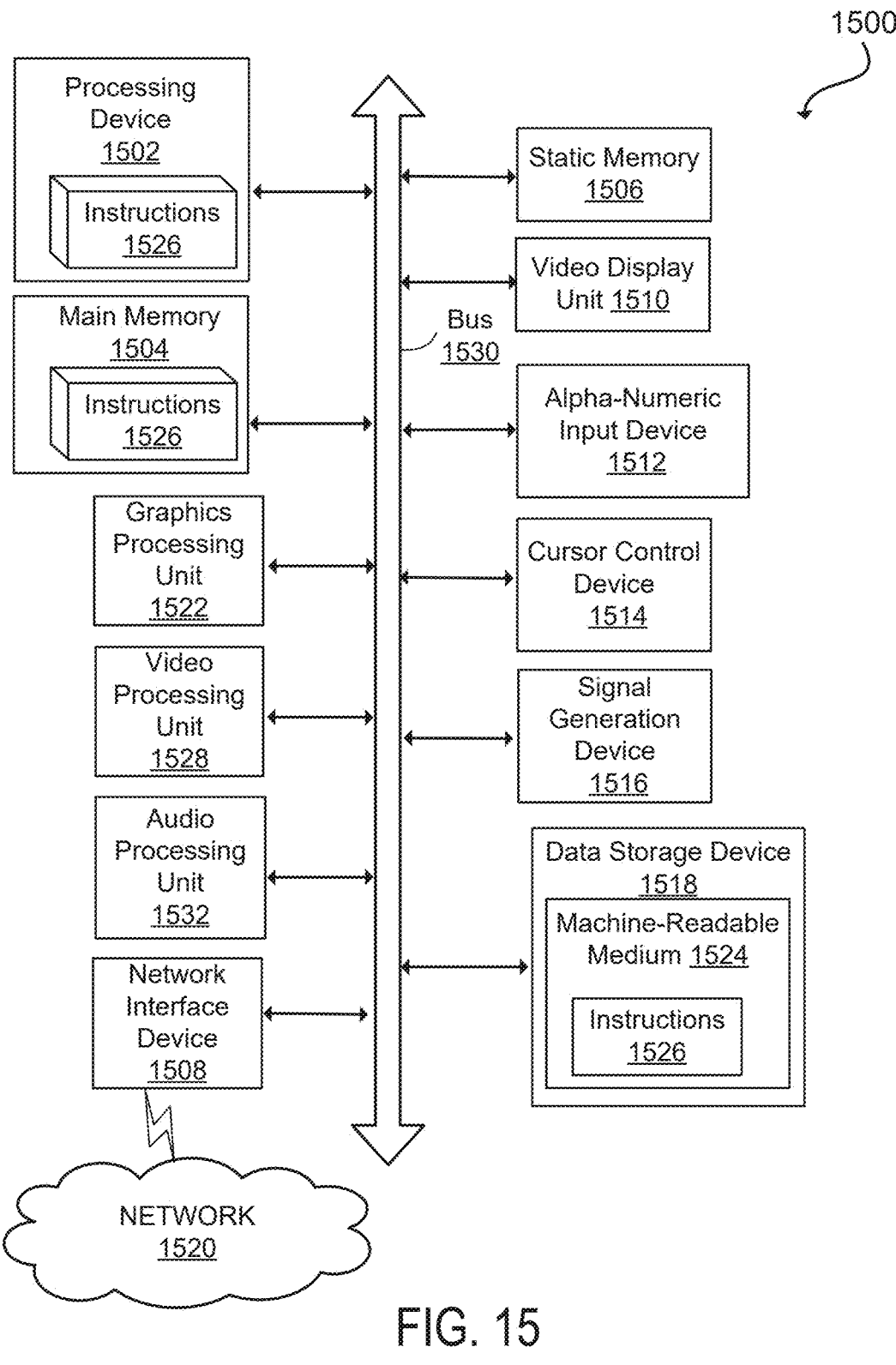
FIG. 15 depicts a flowchart of various processes used during the design and manufacture of an integrated circuit in accordance with some embodiments of the present disclosure.

FIG. 15 illustrates an example set of processes 1500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1510 with information supplied by a designer, information which is transformed to create an article of manufacture that uses a set of EDA processes 1512. When the design is finalized, the design is taped-out 1534, which is when artwork (e.g., geometric patterns) for the integrated circuit is sent to a fabrication facility to manufacture the mask set, which is then used to manufacture the integrated circuit. After tape-out, a semiconductor die is fabricated 1536 and packaging and assembly processes 1538 are performed to produce the finished integrated circuit 1540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 15. The processes described by be enabled by EDA products (or EDA systems).

During system design 1514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1520, the netlist is checked for compliance with timing constraints and for correspondence with the HDL code. During design planning 1522, an overall floor plan for the integrated circuit is constructed and analyzed for timing and top-level routing.

During layout or physical implementation 1524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1526, the circuit function is verified at the layout level, which permits refinement of the layout design. During physical verification 1528, the layout design is checked to ensure that manufacturing constraints are correct, such as DRC constraints, electrical constraints, lithographic constraints, and that circuitry function matches the HDL design specification. During resolution enhancement 1530, the geometry of the layout is transformed to improve how the circuit design is manufactured.

During tape-out, data is created to be used (after lithographic enhancements are applied if appropriate) for production of lithography masks. During mask data preparation 1532, the 'tape-out' data is used to produce lithography masks that are used to produce finished integrated circuits.

A storage subsystem of a computer system may be used to store the programs and data structures that are used by some or all of the EDA products described herein, and products used for development of cells for the library and for physical and logical design that use the library.

Figure 16:
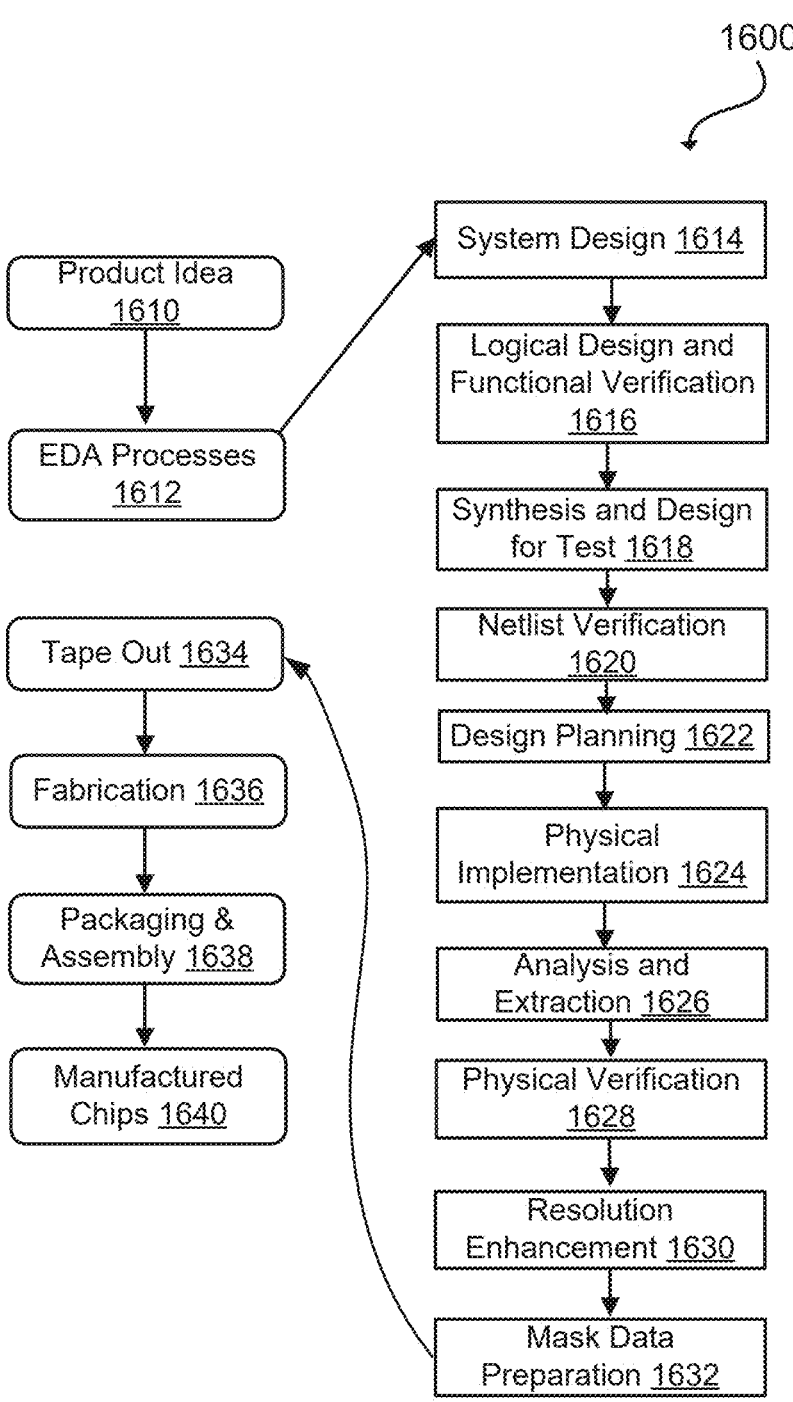
FIG. 16 depicts a diagram of an example computer system in which embodiments of the present disclosure may operate.

FIG. 16 illustrates an example machine of a computer system 1600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM), a static memory 1606 (e.g., flash memory, static random access memory (SRAM), etc.), and a data storage device 1618, which communicate with each other via a bus 1630.

Processing device 1602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. The processing device 1602 may be configured to execute instructions 1626 for performing the operations and steps described herein.

The computer system 1600 may further include a network interface device 1608 to communicate over the network 1620. The computer system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), a graphics processing unit 1622, a signal generation device 1616 (e.g., a speaker), graphics processing unit 1622, video processing unit 1628, and audio processing unit 1632.

The data storage device 1618 may include a machine-readable storage medium 1624 (also known as a non-transistory computer-readable medium) on which is stored one or more sets of instructions 1626 or software embodying any one or more of the methodologies or functions described herein. The instructions 1626 may also reside, completely or at least partially, within the main memory 1604 and/or within the processing device 1602 during execution thereof by the computer system 1600, the main memory 1604 and the processing device 1602 also constituting machine-readable storage media.

In some implementations, the instructions 1626 include instructions to implement functionality corresponding to the present disclosure. While the machine-readable storage medium 1624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit (IC), comprising:
a memory cell comprising,
first and second inverters in a cross-coupled arrangement, wherein the first inverter comprises a pull-up transistor coupled to a supply voltage, and a pull-down transistor coupled to a reference voltage;
a write circuit to write to the memory cell;
a read circuit to read the memory cell; and
an interrupt circuit to disable at least a portion of the first inverter when the read circuit reads the memory cell, wherein the interrupt circuit comprises a first gate transistor to couple the pull-up transistor to an output node of the first inverter, and a second gate transistor to couple the pull-down transistor to the output node of the first inverter, and wherein one or more of the first and second gate transistors is controlled at least in part by a read wordline.

2. The IC of claim 1, wherein:
one of the first and second gate transistors is controlled by the wordline; and
the other one of the first and second gate transistors is controlled by a read/write wordline that represents a logical OR of inverted states of the read wordline and the write wordline.

3. The IC of claim 1, wherein:
one of the first and second gate transistors is controlled by a first read/write wordline that represents a logical OR of the read wordline and the write wordline; and the other one of the first and second gate transistors is controlled by a second read/write wordline that represents a logical OR of inverted states of the read wordline and the write wordline.

4. The IC of claim 1, wherein:
the write circuit comprises first and second write transistors controlled by respective first and second write wordlines;
the read wordline comprises first and second read wordlines;
the read circuit comprises first and second read transistors controlled by respective ones of the first and second read wordlines;
the first gate transistor is controlled by a first read/write wordline that represents a logical OR of the first write wordline and the first read wordline; and
the second gate transistor is controlled by a second read/write wordline that represents logical OR of the second write wordline and the second read wordline.

5. The IC of claim 1, wherein:
the write circuit comprises first and second write transistors controlled by respective first and second write wordlines;
the read wordline comprises first and second read wordlines;
the read circuit comprises first and second read transistors controlled by respective ones of the first and second read wordlines;
the IC further comprises a pre-charge circuit to pre-charge a read bitline;
one of the first and second gate transistors is controlled by the first write wordline; and
the other one of the first and second gate transistors is controlled by a read/write wordline that represents a logical OR of the second write wordline and the second read wordline.

6. The IC of claim 1, wherein:
the write circuit comprises first and second write transistors controlled by respective first and second write wordlines;
the read circuit comprises a read transistor controlled by the read wordline;
the IC further comprises a pre-charge circuit to pre-charge a read bitline;
one of the first and second gate transistors is controlled by the first write wordline; and
the other one of the first and second gate transistors is controlled by a read/write wordline that represents logical OR of the second write wordline and an inverted state of the read wordline.

7. The IC of claim 1, wherein:
the write circuit comprises first and second write transistors controlled by respective first and second write wordlines, and mask circuitry to disable writing to the memory cell during a write operation directed to another memory cell controlled by the first and second write wordlines.

8. The IC of claim 7, wherein:
the mask circuitry comprises a pull-up transistor to provide a logic 1 to the first write transistor, and a pull-down transistor to provide a logic 0 to second write transistor; and
the IC further comprises control circuitry to enable one of the pull-up transistor and the pull-down transistor for a write operation directed to the memory cell, and to disable the pull-up transistor and the pull-down transistor for a write operation directed to another memory cell of the first and second write wordlines.

9. The IC of claim 7, wherein:

the read wordline comprises first and second read wordlines;

the read circuit comprises first and second read transistors controlled by respective ones of the first and second read wordlines;

one of the first and second gate transistors is controlled by a first read/write wordline that represents a logical OR of the first write wordline and the first read wordline; and the other one of the first and second gate transistors is controlled by a second read/write wordline that represents a logical OR of the second write wordline and the second read wordline.

10. The IC of claim 7, wherein:

the read circuit comprises a read transistor controlled by the read wordline;

the IC further comprises a pre-charge circuit to pre-charge a read bitline;

one of the first and second gate transistors is controlled by a first read/write wordline that represents logical OR of the first write wordline and the read wordline; and the other one of the first and second gate transistors is controlled by a second read/write wordline that represents a logical OR of the second wordline and an inverted state of the read wordline.

11. The IC of claim 10, wherein the IC device further comprises up to 12 transistors and up to 5 wordlines.

12. A system, comprising:

a memory controller; and an array of memory cells, each comprising, first and second inverters in a cross-coupled arrangement, wherein the first inverter comprises a pull-up transistor coupled to a supply voltage, and a pull-down transistor coupled to a reference voltage a write circuit to write to the memory cell;

a read circuit to read the memory cell; and an interrupt circuit to disable at least a portion of the first inverter when the read circuit reads the memory cell, wherein the interrupt circuit comprises a first gate transistor to couple the pull-up transistor to an output node of the first inverter, and a second gate transistor to couple the pull-down transistor to the output node of the first inverter, and wherein one or more of the first and second gate transistors is controlled at least in part by a read wordline.

13. The system of claim 12, wherein:

one of the first and second gate transistors is controlled by the wordline; and the other one of the first and second gate transistors is controlled by a read/write wordline that represents a logical OR of inverted states of the read wordline and the write wordline.

14. The system of claim 12, wherein:

one of the first and second gate transistors is controlled by a first read/write wordline that represents a logical OR of the read wordline and the write wordline; and the other one of the first and second gate transistors is controlled by a second read/write wordline that represents a logical OR of inverted states of the read wordline and the write wordline.

15. A non-transitory computer readable medium comprising stored instructions, which when executed by a processor, cause the processor to:

synthesize a memory cell of a circuit design to include:

first and second inverters in a cross-coupled arrangement, wherein the first inverter comprises a pull-up transistor coupled to a supply voltage, and a pull-down transistor coupled to a reference voltage:

a write circuit to write to the memory cell;

a read circuit to read the memory cell; and an interrupt circuit to disable at least a portion of the first inverter when the read circuit reads the memory cell, wherein the interrupt circuit comprises a first gate transistor to couple the pull-up transistor to an output node of the first inverter, and a second gate transistor to couple the pull-down transistor to the output node of the first inverter, and wherein one or more of the first and second gate transistors is controlled at least in part by a read wordline.

16. The non-transitory computer readable medium of claim 15, wherein the stored instructions, when executed by the processor, further cause the processor to:

synthesize the circuit design such that:

one of the first and second gate transistors is controlled by the wordline; and the other one of the first and second gate transistors is controlled by a read/write wordline that represents a logical OR of inverted states of the read wordline and the write wordline.

17. The non-transitory computer readable medium of claim 15, wherein the stored instructions, when executed by the processor, further cause the processor to:

synthesize the circuit design such that:

one of the first and second gate transistors is controlled by a first read/write wordline that represents a logical OR of the read wordline and the write wordline; and the other one of the first and second gate transistors is controlled by a second read/write wordline that represents a logical OR of inverted states of the read wordline and the write wordline.

* * * * *